US011322592B2

(12) United States Patent
Maeda et al.

(10) Patent No.: US 11,322,592 B2
(45) Date of Patent: May 3, 2022

(54) FIELD EFFECT TRANSISTOR WITH CHANNEL LAYER WITH ATOMIC LAYER, AND SEMICONDUCTOR DEVICE INCLUDING THE SAME

(71) Applicant: SAMSUNG ELECTRONICS CO., LTD., Suwon-si (KR)

(72) Inventors: Shigenobu Maeda, Seongnam-si (KR); Seunghan Seo, Seoul (KR); Yeohyun Sung, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/881,133

(22) Filed: May 22, 2020

(65) Prior Publication Data
US 2020/0286999 A1 Sep. 10, 2020

Related U.S. Application Data

(63) Continuation of application No. 15/911,182, filed on Mar. 5, 2018, now Pat. No. 10,749,000, which is a
(Continued)

(30) Foreign Application Priority Data

Dec. 2, 2015 (KR) ........................ 10-2015-0170784

(51) Int. Cl.
*H01L 29/06* (2006.01)
*H01L 29/16* (2006.01)
(Continued)

(52) U.S. Cl.
CPC .......... *H01L 29/1606* (2013.01); *H01L 29/04* (2013.01); *H01L 29/0847* (2013.01);
(Continued)

(58) Field of Classification Search
CPC .......... H01L 29/1606; H01L 29/78681; H01L 29/78684; H01L 29/78696;
(Continued)

(56) References Cited

U.S. PATENT DOCUMENTS 5,317,034 A 5/1994 Nakamura et al.
5,321,050 A 6/1994 Morimoto et al.
(Continued)

FOREIGN PATENT DOCUMENTS

CN 103208524 A 7/2013
CN 104425615 A 3/2015
(Continued)

OTHER PUBLICATIONS

Xiaoyu Han et al: "Strain and Orientation Modulated Bandgaps and Effective Masses of Phosphorene Nanoribbons", Nano Letters, 2014, 14, (8 pages total).
(Continued)

*Primary Examiner* — Caleb E Henry
(74) *Attorney, Agent, or Firm* — Sughrue Mion, PLLC

(57) ABSTRACT

A semiconductor device, a field effect transistor, and a fin field effect transistor are provided. The semiconductor device may include a channel layer, a source/drain layer, and a gate electrode. The channel layer is provided on a substrate and extends in a direction perpendicular to a top surface of the substrate. The source/drain layer is disposed at a side of the channel layer and is electrically connected to the channel layer. The gate electrode is provided adjacent to at least one of surfaces of the channel layer. The channel layer includes a two-dimensional atomic layer made of a first material.

19 Claims, 32 Drawing Sheets

Related U.S. Application Data continuation of application No. 15/340,199, filed on Nov. 1, 2016, now Pat. No. 9,941,360.

(51) Int. Cl.
| | |
|---|---|
| *H01L 29/08* | (2006.01) |
| *H01L 29/10* | (2006.01) |
| *H01L 29/165* | (2006.01) |
| *H01L 29/20* | (2006.01) |
| *H01L 29/22* | (2006.01) |
| *H01L 29/24* | (2006.01) |
| *H01L 29/267* | (2006.01) |
| *H01L 29/66* | (2006.01) |
| *H01L 29/778* | (2006.01) |
| *H01L 29/78* | (2006.01) |
| *H01L 29/786* | (2006.01) |
| *H01L 29/04* | (2006.01) |
| H01L 29/51 | (2006.01) |

(52) U.S. Cl.
CPC ...... *H01L 29/1037* (2013.01); *H01L 29/1054* (2013.01); *H01L 29/165* (2013.01); *H01L 29/2003* (2013.01); *H01L 29/22* (2013.01); *H01L 29/24* (2013.01); *H01L 29/267* (2013.01); *H01L 29/66742* (2013.01); *H01L 29/778* (2013.01); *H01L 29/78* (2013.01); *H01L 29/786* (2013.01); *H01L 29/78618* (2013.01); *H01L 29/78681* (2013.01); *H01L 29/78684* (2013.01); *H01L 29/78696* (2013.01); *H01L 29/517* (2013.01)

(58) Field of Classification Search
CPC ......... H01L 29/78618; H01L 29/66742; H01L 29/165; H01L 29/267; H01L 29/778; H01L 29/786; H01L 29/24; H01L 29/04; H01L 29/0847; H01L 29/1037; H01L 29/1054; H01L 29/2003; H01L 29/22; H01L 29/78; H01L 29/517; H01L 29/16; H01L 29/785

See application file for complete search history.

(56) References Cited

U.S. PATENT DOCUMENTS

| | | | |
|---|---|---|---|
| 5,371,057 A | 12/1994 | Morimoto et al. | |
| 5,385,878 A | 1/1995 | Nakamura et al. | |
| 5,550,168 A | 8/1996 | Nakamura et al. | |
| 6,177,197 B1 | 1/2001 | Imashiro et al. | |
| 6,232,606 B1* | 5/2001 | Singh | H01L 27/14643 250/370.01 |
| 7,732,859 B2* | 6/2010 | Anderson | H04L 29/785 257/328 |
| 7,742,328 B2* | 6/2010 | Chen | B82Y 10/00 365/158 |
| 7,902,275 B2 | 3/2011 | Gerhardt et al. | |
| 7,902,576 B2 | 3/2011 | Chakravarthi et al. | |
| 7,968,957 B2 | 6/2011 | Murthy et al. | |
| 8,183,627 B2* | 5/2012 | Currie | H01L 29/785 257/329 |
| 8,470,477 B2 | 6/2013 | Miwa et al. | |
| 8,546,815 B2 | 10/2013 | Yano et al. | |
| 8,568,887 B2 | 10/2013 | Wu et al. | |
| 8,772,098 B2 | 7/2014 | Dimitrakopoulos et al. | |
| 8,809,837 B2 | 8/2014 | Farmer et al. | |
| 9,012,889 B2 | 4/2015 | Lee | |
| 9,059,265 B2 | 6/2015 | Gunlycke et al. | |
| 9,093,507 B2 | 7/2015 | Cohen et al. | |
| 9,096,431 B2 | 8/2015 | Wee et al. | |
| 9,120,677 B2 | 9/2015 | Watson et al. | |
| 9,171,907 B2 | 10/2015 | de Heer | |
| 9,178,068 B1* | 11/2015 | Cheng | H01L 29/0653 |
| 9,181,089 B2 | 11/2015 | Liu | |
| 9,203,041 B2 | 12/2015 | Han et al. | |
| 10,418,448 B2* | 9/2019 | Cantoro | H01L 27/0886 |
| 10,749,000 B2* | 8/2020 | Maeda | H01L 29/2003 |
| 2004/0031970 A1 | 2/2004 | Chakravarthi et al. | |
| 2005/0156202 A1* | 7/2005 | Rhee | H01L 29/66795 257/213 |
| 2005/0184316 A1* | 8/2005 | Kim | H01L 29/785 257/213 |
| 2005/0224800 A1* | 10/2005 | Lindert | H01L 29/1054 257/66 |
| 2007/0020901 A1 | 1/2007 | Ino et al. | |
| 2007/0023839 A1* | 2/2007 | Furukawa | B82Y 10/00 257/353 |
| 2007/0072383 A1 | 3/2007 | Chakravarthi et al. | |
| 2009/0020764 A1* | 1/2009 | Anderson | H01L 29/1606 257/77 |
| 2010/0055388 A1* | 3/2010 | Chen | H01L 29/66795 428/119 |
| 2010/0102292 A1* | 4/2010 | Hiura | H01L 21/823828 257/9 |
| 2010/0229758 A1 | 9/2010 | Gerhardt et al. | |
| 2011/0018031 A1 | 1/2011 | Murthy et al. | |
| 2011/0114894 A1 | 5/2011 | Choi et al. | |
| 2011/0121298 A1* | 5/2011 | Ichiryu | H01L 29/458 257/57 |
| 2011/0223480 A1 | 9/2011 | Wee et al. | |
| 2012/0049160 A1* | 3/2012 | Sano | H01L 21/823807 257/27 |
| 2012/0121916 A1 | 5/2012 | Wu et al. | |
| 2012/0132882 A1* | 5/2012 | Seo | H01L 27/2481 257/4 |
| 2012/0175595 A1* | 7/2012 | Chung | H01L 29/775 257/29 |
| 2012/0223330 A1 | 9/2012 | Dhar et al. | |
| 2012/0241767 A1 | 9/2012 | Yano et al. | |
| 2012/0261643 A1* | 10/2012 | Cohen | H01L 21/02381 257/27 |
| 2013/0001556 A1* | 1/2013 | Hu | H01L 29/4908 257/53 |
| 2013/0033310 A1 | 2/2013 | Liu | |
| 2013/0047423 A1 | 2/2013 | Miwa et al. | |
| 2013/0193412 A1 | 8/2013 | Lee et al. | |
| 2013/0313522 A1* | 11/2013 | Nourbakhsh | H01L 29/4908 257/29 |
| 2013/0315816 A1 | 11/2013 | Watson et al. | |
| 2013/0334497 A1* | 12/2013 | Weman | B82Y 30/00 257/26 |
| 2013/0337620 A1 | 12/2013 | Dimitrakopoulos et al. | |
| 2014/0015015 A1* | 1/2014 | Krivokapic | H01L 21/0262 257/288 |
| 2014/0042390 A1* | 2/2014 | Gruner | H01M 4/625 257/14 |
| 2014/0051217 A1 | 2/2014 | Cohen et al. | |
| 2014/0138626 A1 | 5/2014 | Farmer et al. | |
| 2014/0145148 A1* | 5/2014 | Lee | H01L 29/778 257/29 |
| 2014/0158988 A1 | 6/2014 | Chen et al. | |
| 2014/0166984 A1 | 6/2014 | Gunlycke et al. | |
| 2014/0319452 A1 | 10/2014 | Seabaugh et al. | |
| 2014/0361250 A1 | 12/2014 | de Heer | |
| 2015/0023858 A1 | 1/2015 | Tour | |
| 2015/0034908 A1 | 2/2015 | Meade et al. | |
| 2015/0108499 A1* | 4/2015 | Alptekin | H01L 21/02507 257/77 |
| 2015/0214324 A1 | 7/2015 | Moon | |
| 2015/0221884 A1* | 8/2015 | Han | B82Y 10/00 257/29 |
| 2015/0236147 A1* | 8/2015 | Chu | H01L 21/02612 257/29 |
| 2015/0303315 A1 | 10/2015 | Das et al. | |
| 2015/0372246 A1 | 12/2015 | Mueller et al. | |
| 2016/0087042 A1* | 3/2016 | Lee | H01L 29/78684 257/29 |
| 2016/0190244 A1* | 6/2016 | Lee | H01L 29/7839 257/29 |
| 2019/0378834 A1* | 12/2019 | Penumatcha | H01L 29/24 |

(56) References Cited

U.S. PATENT DOCUMENTS

FOREIGN PATENT DOCUMENTS

| CN | 105038069 A | 11/2015 |
|---|---|---|
| KR | 10-2013-0086808 A | 8/2013 |

OTHER PUBLICATIONS

Jingjing Shi et al: "Thermal transport across carbon nanotube-graphene covalent and van der Waals junctions", Journal of Applied Physics, 044302(2015) (8 pages total), Jul. 2015 (AIP Publishing LLC).
Ahmet Avsar et al: "Electrical characterization of fully encapsulated ultrathin black phosphorus-based heterostructures with graphene contacts", Dec. 3, 2014, (32 pages total).
Li, Likai et al., "Black phosphorus field-effect transistors", Nature Nanotechnology, vol. 9, May 2014, pp. 372-376. (5 pages total).
James C. M. Hwang et el., "Phosphorene FETs-Promising Transistors Based on a few Layers of Phosphorus Atoms", Department of Electrical and Computer Engineering Lehigh University, Bethlehem, PA 18015-3181 (4 pages).

* cited by examiner

FIELD EFFECT TRANSISTOR WITH CHANNEL LAYER WITH ATOMIC LAYER, AND SEMICONDUCTOR DEVICE INCLUDING THE SAME

CROSS-REFERENCE TO RELATED APPLICATIONS

This application is a continuation application of U.S. application Ser. No. 15/911,182, filed Mar. 5, 2018, which is a continuation application of U.S. application Ser. No. 15/340,199, filed Nov. 1, 2016 (now U.S. Pat. No. 9,941,360), which claims priority from Korean Patent Application No. 10-2015-0170784, filed on Dec. 2, 2015, in the Korean Intellectual Property Office, the entire contents of all of which are hereby incorporated by reference.

BACKGROUND

The present disclosure relates to a field effect transistor and a semiconductor device including the same, and in particular, to a field effect transistor, in which a channel layer with a two-dimensional atomic layer is provided, and a semiconductor device including the same.

Due to their small-sized, multifunctional, and/or low-cost characteristics, semiconductor devices are used throughout the electronic industry. The semiconductor devices may be classified into a memory device for storing data, a logic device for processing data, and a hybrid device including both memory and logic elements. To meet the increased demand for electronic devices with fast speed and/or low power consumption, it is advantageous to realize semiconductor devices with high reliability, high performance, and/or multiple functions. To achieve this, the complexity and/or integration density of semiconductor devices are being increased.

SUMMARY

It is an aspect to provide field effect transistors with improved electric characteristics.

It is another aspect to provide a semiconductor device including a field effect transistor with improved electric characteristics.

According to an aspect of one or more exemplary embodiments, a semiconductor device may include a channel layer provided on a substrate, the channel layer including a two-dimensional atomic layer made of a first material; and a source/drain layer provided on the substrate, the source/drain layer including a second material, wherein the first material is one of phosphorus allotropes, the second material is one of carbon allotropes, and the channel layer and the source/drain layer are connected to each other by covalent bonds between the first and second materials.

According to another aspect of one or more exemplary embodiments, a semiconductor device may include a channel layer provided on a substrate and extending in a direction perpendicular to a top surface of the substrate; a source/drain layer disposed at a side of the channel layer and electrically connected to the channel layer; and a gate electrode provided adjacent to at least one of surfaces of the channel layer, wherein the channel layer comprises a two-dimensional atomic layer made of a first material.

According to another aspect of one or more exemplary embodiments, a field effect transistor may include a channel comprising a two-dimensional atomic layer made of a first material; and a source/drain comprising a two-dimensional atomic layer made of a second material, wherein the channel and the source/drain are connected to each other by covalent bonds between the first and second materials.

According to another aspect of one or more exemplary embodiments, a field effect transistor may include a channel containing phosphorene; and a source/drain comprising a material connected to the phosphorene by covalent bonds, wherein the material is graphene, carbon nanotube, hexagonal boron nitride, molybdenum disulphide, silicene, or germanene.

According to another aspect of one or more exemplary embodiments, a fin field effect transistor (FinFET) may include a phosphorene channel layer; a graphene source region connected to the phosphorene channel layer by covalent bonds; and a graphene drain region connected to the phosphorene channel layer by covalent bonds.

BRIEF DESCRIPTION OF THE DRAWINGS

Exemplary embodiments will be more clearly understood from the following brief description taken in conjunction with the accompanying drawings, in which.

DETAILED DESCRIPTION

Figure 1A:
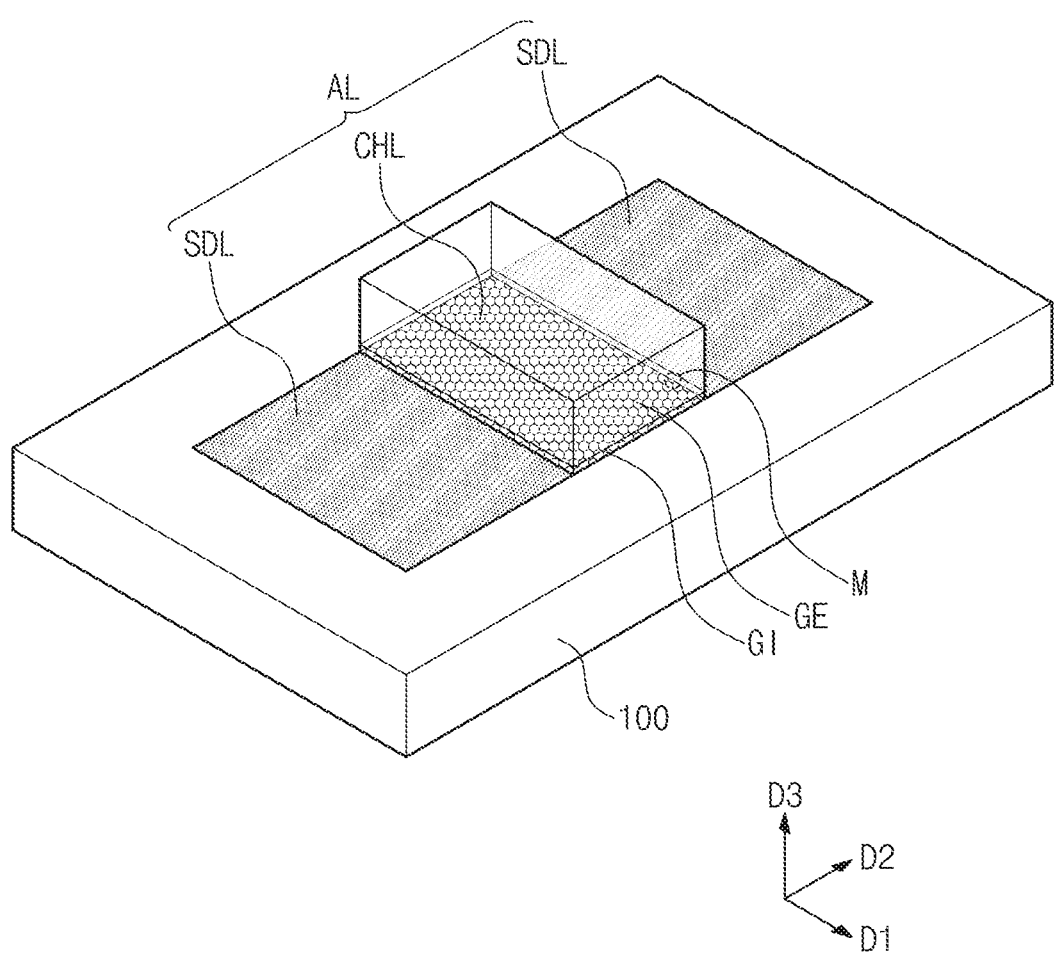
FIG. 1A is a perspective view illustrating a semiconductor device according to some exemplary embodiments.

The inventive concepts will now be described more fully hereinafter with reference to the accompanying drawings, in which exemplary embodiments of the inventive concepts are shown. It should be noted that the drawing figures are intended to illustrate the general characteristics of methods, structure and/or materials utilized in certain exemplary embodiments and to supplement the written description provided below. These drawings are not, however, to scale and may not precisely reflect the precise structural or performance characteristics of any given exemplary embodiment, and should not be interpreted as defining or limiting the range of values or properties encompassed by various exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

The inventive concepts and methods of achieving them will be apparent from the following exemplary embodiments that will be described in more detail with reference to the accompanying drawings. The exemplary embodiments of the inventive concept may, however, be embodied in different forms and should not be constructed as limited to the exemplary embodiments set forth herein. Rather, these exemplary embodiments are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. Additionally, the exemplary embodiments in the detailed description will be described with sectional views as ideal exemplary views of the inventive concepts. Accordingly, shapes of the exemplary views may be modified according to manufacturing techniques and/or allowable errors. Therefore, the exemplary embodiments are not limited to the specific shape illustrated in the exemplary views, but may include other shapes that may be created according to manufacturing processes.

Exemplary embodiments of aspects of the present inventive concepts explained and illustrated herein include their complementary counterparts. The same reference numerals or the same reference designators denote the same elements throughout the specification.

Figure 1B:
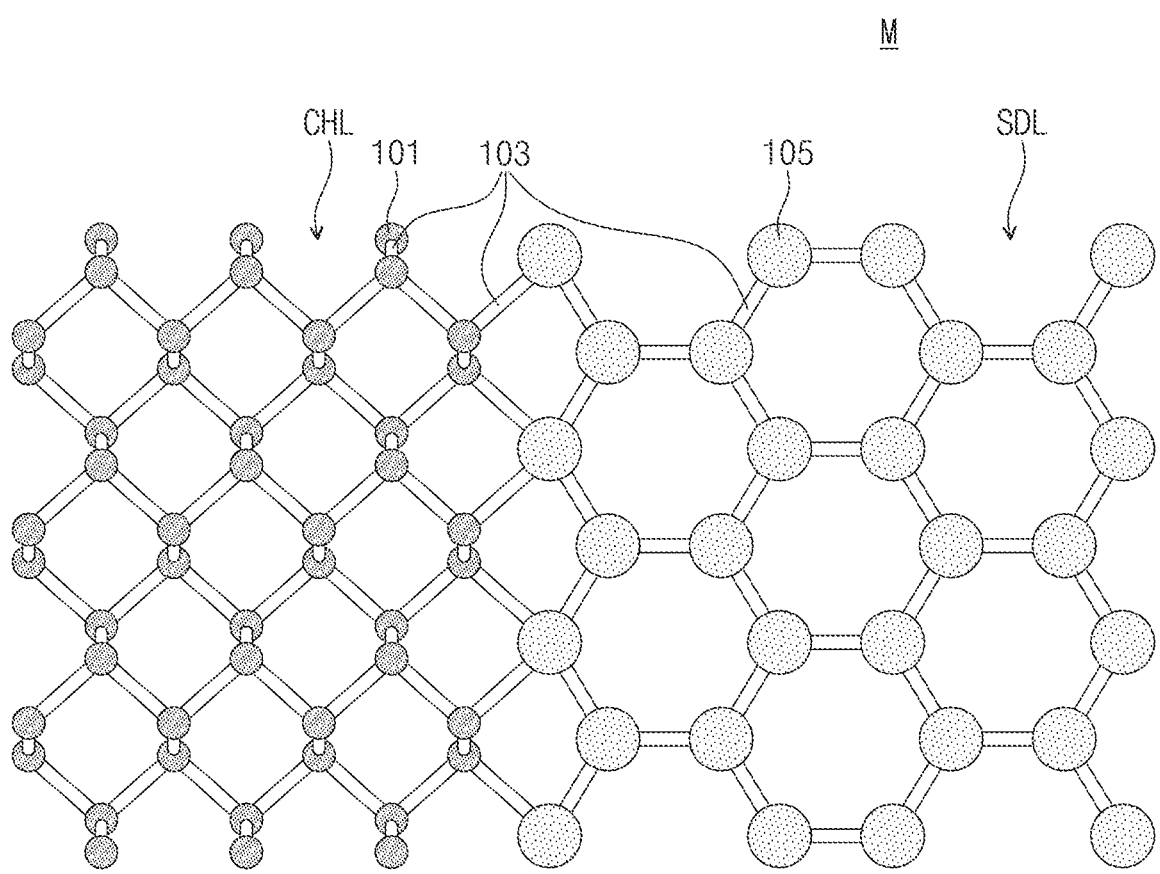
FIG. 1B is an enlarged view of a portion 'M' of FIG. 1A, according to some exemplary embodiments.

FIG. 1A is a perspective view illustrating a semiconductor device according to some exemplary embodiments. FIG. 1B is an enlarged view of a portion IVY of FIG. 1A, according to some exemplary embodiments.

Referring to FIGS. 1A and 1B, a field effect transistor including an active layer AL and a gate electrode GE may be provided on a substrate 100. The substrate 100 may be an insulating substrate containing an insulating material. As an example, the substrate 100 may be formed of or include at least one of glass, sapphire, quartz, organic polymers, silicon oxide, and silicon nitride.

The active layer AL may include source/drain layers SDL and a channel layer CHL disposed between the source/drain layers SDL. The channel layer CHL may include a two-dimensional atomic layer made of a first material, and each of the source/drain layers SDL may include a two-dimensional atomic layer made of a second material. In some exemplary embodiments, the channel layer CHL may consist of the first material, and each of the source/drain layers SDL may consist of the second material. In some exemplary embodiments, the first and second materials may be the same material or allotropes of each other, but in certain exemplary embodiments, the first and second materials may be different materials or may contain atoms different from each other.

The two-dimensional atomic layer may be or may include a single atomic layer, in which atoms are connected to each other by covalent bonds. In the single atomic layer, the atoms may be located to form a substantially two-dimensional arrangement. Each of the first and second materials may include a single atomic layer, or a plurality of stacked atomic layers. In other words, each of the first and second materials may be provided to have a mono-layered structure or a multi-layered structure. In the case of the multi-layered structure, the multi-layered structure may include 2 to about 100 stacked atomic layers. In the case of the multi-layered structure, the stacked atomic layers may be coupled to each other by a van der Waals' attractive force. As an example, each of the channel layer CHL and the source/drain layers SDL may be a single atomic layer. As another example, each of the channel layer CHL and the source/drain layers SDL may be composed of a plurality of atomic layers.

Each of the first and second materials may be an electrically conductive material. That is, an electron mobility and a hole mobility may be defined for each of the first and second materials. Each of the first and second materials may be a metal-like material, a semiconductor material with a finite energy band gap, and so forth. As an example, the first material may be a semiconductor material, and the second material may be a metal-like material.

The first material may be phosphorene, graphene, hexagonal boron nitride, molybdenum disulphide ($MoS_2$), silicene, or germanene. In some exemplary embodiments, the first material may be phosphorene that is a semiconductor material. However, in certain exemplary embodiments, the first material may be or may include allotropes of phosphorus (P), which are provided in the form of the two-dimensional atomic layer. The phosphorene may have similar or higher electron and/or hole mobility than an electron and/or hole mobility of silicon, and a leakage current, which is lower than a leakage current of silicon, and thus, the phosphorene may be used as a channel layer of the field effect transistor.

The phosphorus atoms in the phosphorene may be arranged in various forms in the two-dimensional atomic layer. As an example, the phosphorene may be arranged to have an armchair structure, a diagonal structure, a zigzag structure, or any combination thereof An energy band gap of the phosphorene may be changed depending on its atomic arrangement. The phosphorene of the diagonal structure may have an energy band gap larger than an energy band gap of the phosphorene of the armchair structure, and the phosphorene of the zigzag structure may have an energy band gap larger than an energy band gap of the phosphorene of the diagonal structure. Accordingly, by changing the structure of the phosphorene for the channel layer CHL, it is possible to change a threshold voltage of the field effect transistor. As an example, for the field effect transistor with a low threshold voltage, the phosphorene of the channel layer CHL may be formed to have an armchair structure. By contrast, for the field effect transistor with a high threshold voltage, the phosphorene of the channel layer CHL may be formed to have a zigzag structure.

The threshold voltage of the field effect transistor may be changed by other methods. For example, the threshold voltage of the field effect transistor may be changed by adjusting the number of atomic phosphorus layers constituting the first material.

The second material may be graphene, hexagonal boron nitride, molybdenum disulphide, silicene, or germanene. In some exemplary embodiments, the second material may be graphene that is one of metal-like materials with high electrical conductivity. However, in certain exemplary embodiments, the second material may be or may include allotropes of carbon (C), which are provided in the form of a two-dimensional atomic layer. Since the energy band gap of the graphene is substantially zero, in some cases the graphene may not be suitable for the channel layer of the field effect transistor. However, since the graphene has very high electron and/or hole mobility, the graphene may be more suitably used for the source/drain regions of the field effect transistor. The graphene may be used to compensate for a relatively low electron mobility of the phosphorene for the channel layer.

The first and second materials may be coupled to each other by covalent bonds or by a van der Waals' attractive force. Accordingly, the channel layer CHL may be directly connected to the source/drain layers SDL. In the case where the first and second materials are coupled to each other by covalent bonds, electrical conductivity of the resulting structure may be high, when compared with that by the van der Waals' attractive force. This high electrical conductivity from the covalent bonds may make it possible to realize the field effect transistor with improved electric characteristics.

Referring back to FIG. 1B, in the case where the first and second materials are made of phosphorene and graphene, respectively, the first and second materials may be coupled to each other by covalent bonds 103. Phosphorus atoms 101 of the phosphorene may be coupled to each other by covalent bonds 103, carbon atoms 105 of the graphene may be coupled to each other by covalent bonds 103, and thus, covalent bonds 103 between the phosphorus atoms 101 and carbon atoms 105 may be formed at an interface between the phosphorene and the graphene.

Referring back to FIG. 1A, the gate electrode GE may be disposed on the channel layer CHL. A gate dielectric layer GI may be interposed between the gate electrode GE and the channel layer CHL. The gate electrode GE may include at least one of conductive materials. As an example, the gate electrode GE may be formed of or include at one or more of doped semiconductors (e.g., doped silicon, doped silicon-germanium, doped germanium, and so forth), metals (e.g., titanium, tantalum, tungsten, aluminum, and so forth), conductive metal nitrides (e.g., titanium nitride, tantalum nitride, and so forth), or metal-semiconductor compounds (e.g., tungsten silicide, cobalt silicide, nickel silicide, titanium silicide, and so forth). The gate dielectric layer GI may include at least one of high-k dielectric materials. As an example, the gate dielectric layer GI may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Figure 2:
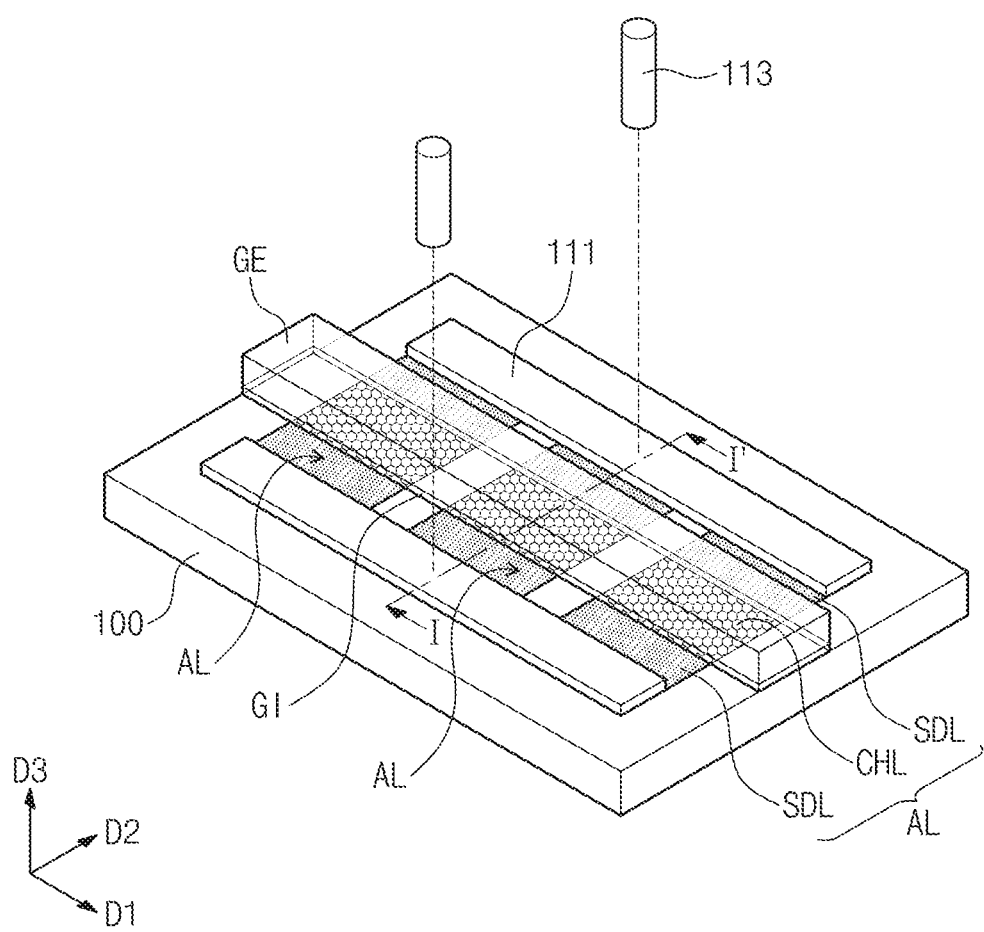
FIG. 2 is a perspective view illustrating a semiconductor device according to some exemplary embodiments.
Figure 3:
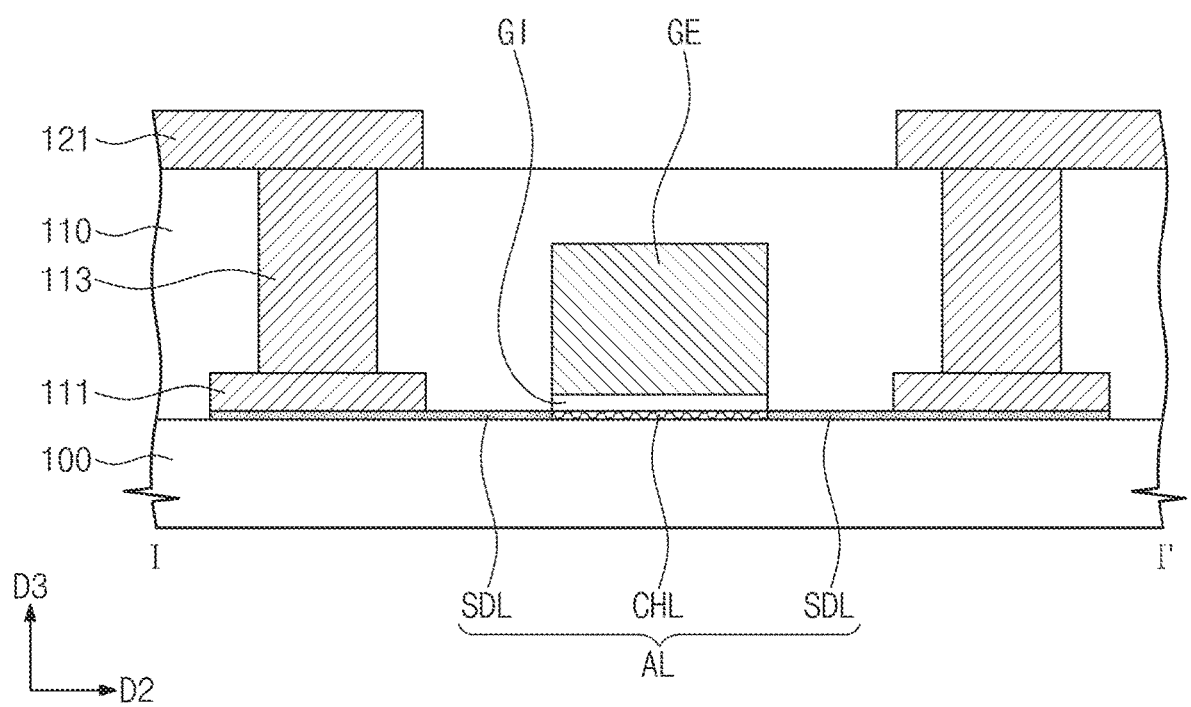
FIG. 3 is a sectional view taken along line I-I' of FIG. 2.

FIG. 2 is a perspective view illustrating a semiconductor device according to some exemplary embodiments. FIG. 3 is a sectional view taken along line I-I' of FIG. 2. In the following description, an element previously described with reference to FIGS. 1A and 1B may be identified by a similar or identical reference number without repeating an overlapping description thereof.

Referring to FIGS. 2 and 3, a semiconductor device including the field effect transistor of FIG. 1A may be provided. In some exemplary embodiments, the semiconductor device may include logic cells configured to process data, and the field effect transistor may be used to realize the logic cells.

In detail, active layers AL may be provided on a substrate 100. For example, FIG. 2 shows three active layers AL arranged side-by-side on the substrate 100. However, this is only an example and any number of active layers AL may be provided. The active layers AL may be arranged in a first direction D1, which is parallel to a top surface of the substrate 100. Each of the active layers AL may include source/drain layers SDL and a channel layer CHL therebetween.

A gate electrode GE may be provided to cross a plurality of the active layers AL. In some exemplary embodiments, the gate electrode GE may be provided to cross a plurality of the channel layers CHL. The gate dielectric layer GI may be interposed between the gate electrode GE and the channel layers CHL. The gate electrode GE and the gate dielectric layer GI may extend in the first direction D1.

Pads 111 may be provided at both sides of the gate electrode GE as shown in FIG. 2. Each of the pads 111 may be provided to cross at least one of the source/drain layers SDL on the side on which the pad 111 is provided. Each of the pads 111 may be electrically connected to the at least one of the source/drain layers SDL. As an example, each of the pads 111 may extend in the first direction D1 and may cross a plurality of the source/drain layers SDL in common. For example, the pad 111 on the right side of the gate electrode GE in FIG. 2 crosses three source/drain layers SDL, and the pad 111 on the left side of the gate electrode GE in FIG. 2 crosses three source/drain layers SDL. The plurality of the source/drain layers SDL may be electrically connected to each other by a corresponding one of the pads 111. In certain exemplary embodiments, each of the pads 111 may be provided on a corresponding one of the source/drain layers SDL, as shown in FIG. 4.

Contacts 113 may be disposed on the pads 111, respectively. An interlayered insulating layer 110 may be provided to cover the active layers AL, the gate electrode GE, the pads 111, and the contacts 113, as shown in FIG. 3. The contacts 113 may be provided to have top surfaces that are substantially coplanar with a top surface of the interlayered insulating layer 110. Interconnection lines 121 may be provided on the interlayered insulating layer 110 and may be electrically connected to the contacts 113, respectively. In other words, the interconnection lines 121 may be provided to allow electrical signals to be applied to the source/drain layers SDL.

The pads 111, the contacts 113, and the interconnection lines 121 may each include at least one of conductive materials (e.g., doped semiconductors, metals, conductive metal nitrides, or metal-semiconductor compounds). The interlayered insulating layer 110 may be formed of or include at least one of a silicon oxide layer, a silicon nitride layer, and a silicon oxynitride layer.

Figure 4:
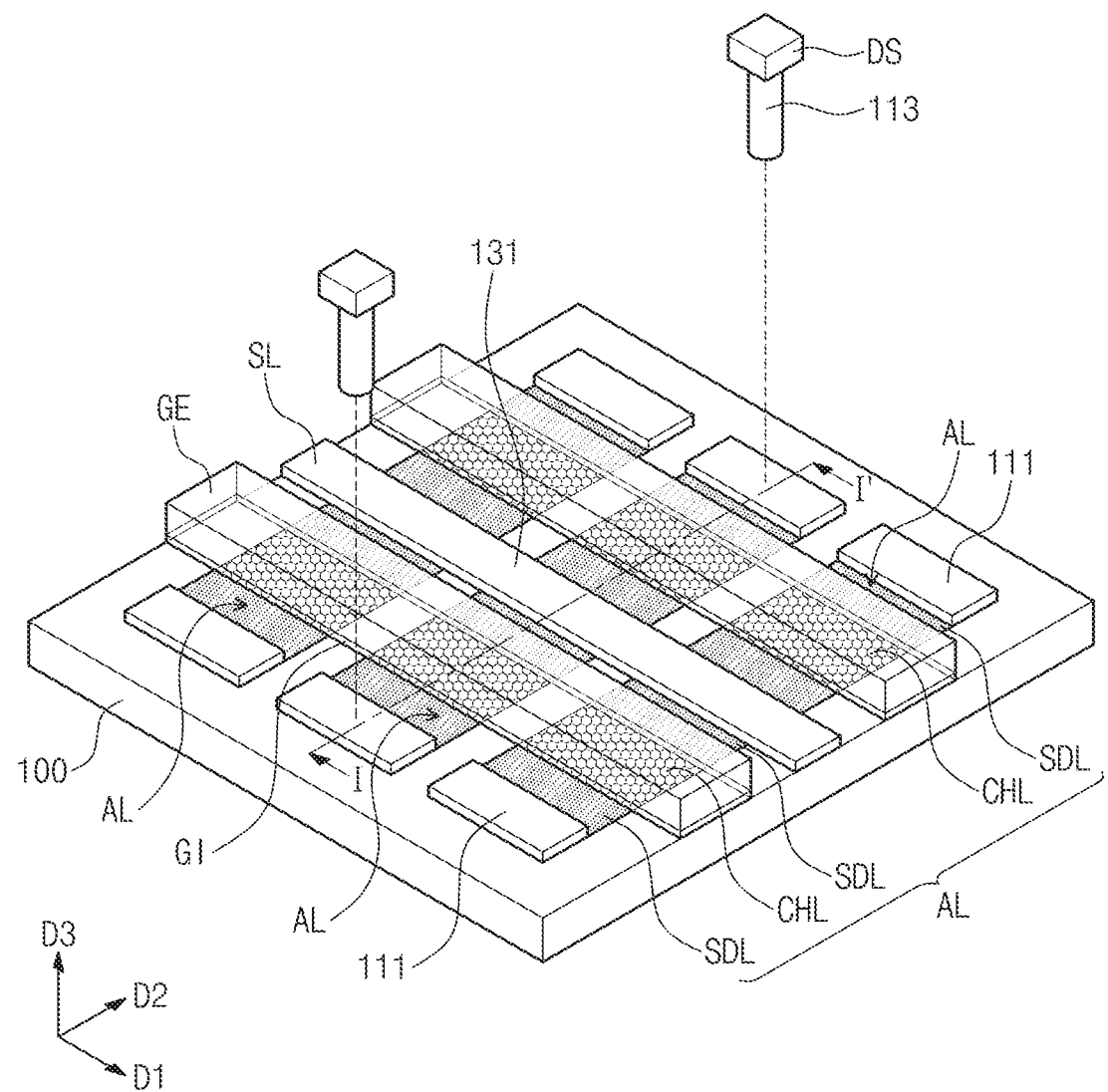
FIG. 4 is a perspective view illustrating a semiconductor device according to some exemplary embodiments.
Figure 5:
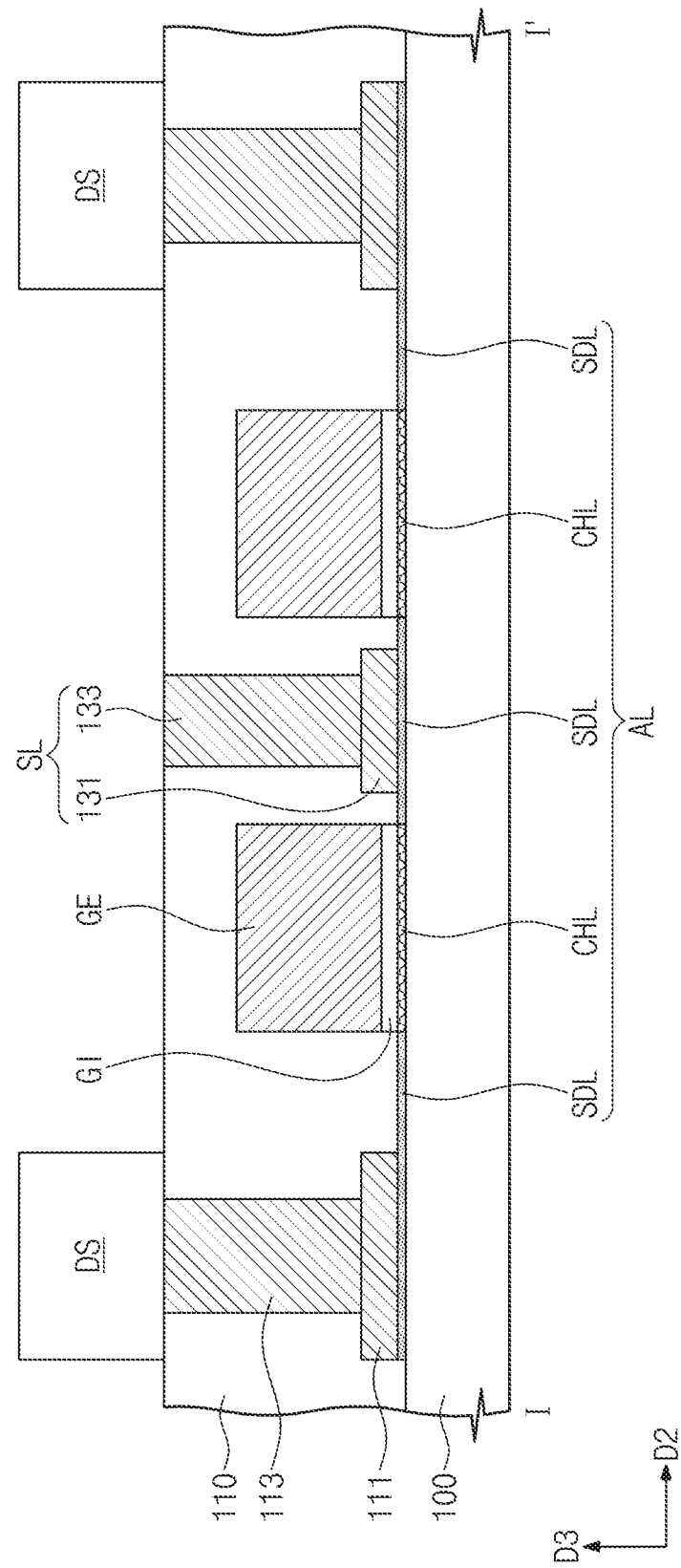
FIG. 5 is a sectional view taken along line I-I' of FIG. 4.

FIG. 4 is a perspective view illustrating a semiconductor device according to some exemplary embodiments. FIG. 5 is a sectional view taken along line I-I' of FIG. 4. In the following description, an element previously described with reference to FIGS. 1A, 1B, 2, and 3 may be identified by a similar or identical reference number without repeating an overlapping description thereof.

Referring to FIGS. 4 and 5, a semiconductor device including the field effect transistor of FIG. 1A may be provided. In some exemplary embodiments, the semiconductor device may include memory cells configured to store data, and the field effect transistor may be used to realize the memory cells.

In detail, active layers AL may be provided on a substrate 100. The active layers AL may be arranged in a first direction D1, and each of the active layers AL may include a plurality of source/drain layers SDL and a plurality of channel layers CHL. For example, FIG. 4 illustrates three active layers AL. However, this is only an example and any number of active layers AL may be provided.

Gate electrodes GE may be disposed to cross the active layers AL. Each of the gate electrodes GE may be provided to cross a plurality of the channel layers CHL arranged in the first direction D1. Gate dielectric layers GI may be respectively interposed between the gate electrodes GE and the channel layers CHL.

A source line SL may be provided on the source/drain layer SDL interposed between a pair of the channel layers CHL. The source line SL may extend in the first direction D1 and may cross a plurality of the source/drain layers SDL arranged in the first direction D1. The source line SL may include a source pad 131, which is in direct contact with the source/drain layers SDL, and a conductive line 133 (see FIG. 5), which is provided on the source pad 131. The source pad 131 and the conductive line 133 may be formed of or include at least one of conductive materials (e.g., doped semiconductors, metals, conductive metal nitrides, or metal-semiconductor compounds). An interlayered insulating layer 110 may be provided on the substrate 100 and may be formed of or include at least one of a silicon oxide layer, a silicon nitride layer, and a silicon oxynitride layer.

Pads 111 may be respectively provided on the source/drain layers SDL that are provided on opposite sides of each of the active layers AL, as shown in FIG. 4. Contacts 113 may be provided on the pads 111, respectively. Data storing elements DS may be provided on the interlayered insulating layer 110 and may be electrically connected to the contacts 113, respectively. The data storing elements DS may be memory elements, each of which is configured to store data. Here, field effect transistors including the active layers AL and the gate electrodes GE may be used as switching elements. In some exemplary embodiments, each of the data storing elements DS may be or may include one of a capacitor, a magnetic tunnel junction pattern, a phase-changeable material, and a memory element with a variable resistance material.

Figure 6A:
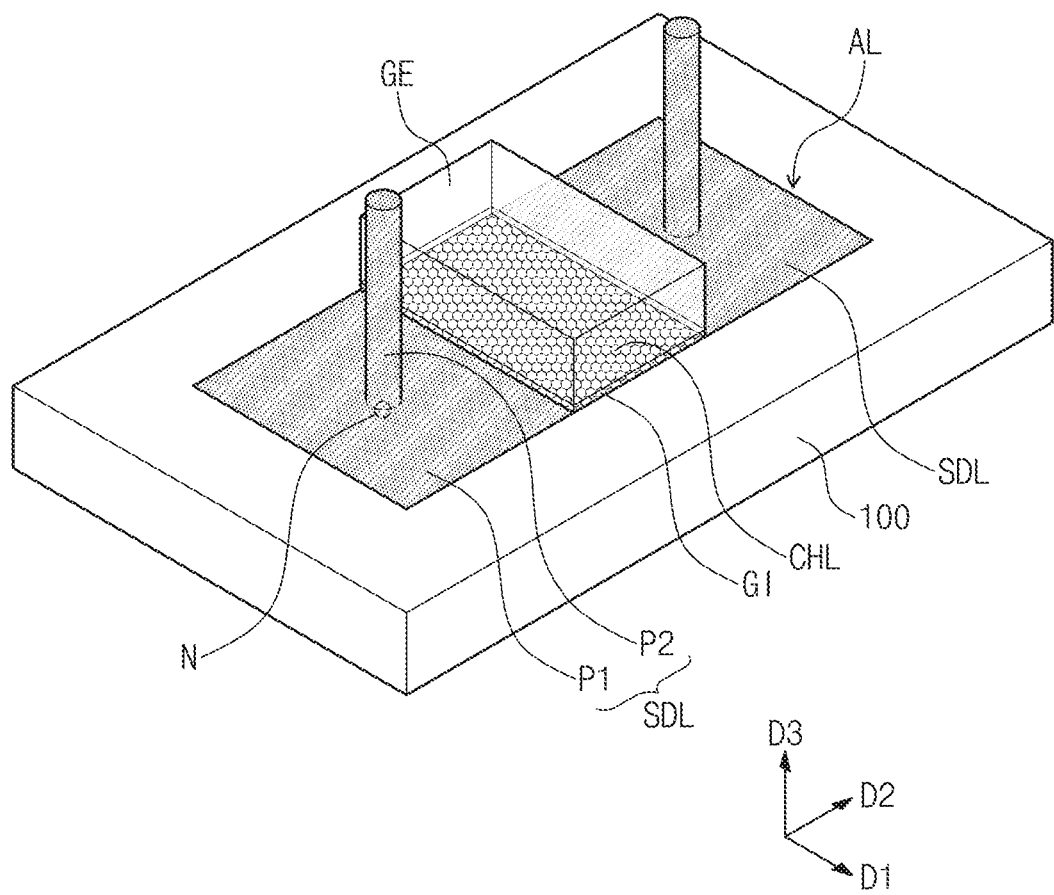
FIG. 6A is a perspective view illustrating a semiconductor device according to some exemplary embodiments.
Figure 6B:
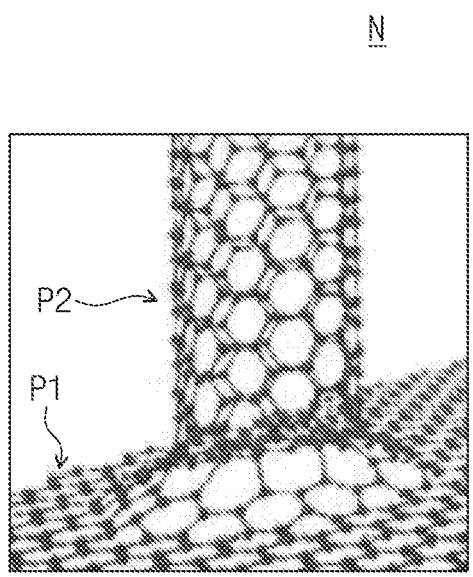
FIG. 6B is an enlarged view of a portion 'N' of FIG. 6A, according to some exemplary embodiments.

FIG. 6A is a perspective view illustrating a semiconductor device according to some exemplary embodiments. FIG. 6B is an enlarged view of a portion 'N' of FIG. 6A, according to some exemplary embodiments. In the following description, an element previously described with reference to FIGS. 1A and 1B may be identified by a similar or identical reference number without repeating an overlapping description thereof.

Referring to FIGS. 6A and 6B, a field effect transistor including an active layer AL and a gate electrode GE may be provided on a substrate 100. The active layer AL may include source/drain layers SDL, each of which includes a planar portion P1 and a pillar portion P2. The planar portion P1 may have a two-dimensional structure which may include a second material. The pillar portions P2 may be disposed on the planar portions P1, respectively, and may have a longitudinal axis parallel to a third direction D3. The third direction D3 may be perpendicular to a top surface of the substrate 100. The pillar portion P2 may function as the pad 111 and the contact 113 described with reference to FIGS. 2 and 3.

Each of the pillar portions P2 may include a three-dimensional atomic layer, which may be formed of a third material. The third material may be a metal-like material, a semiconductor material with a finite energy band gap, and so forth. The third and second materials may be the same material or different materials. As an example, the third material may include at least one carbon nanotube. In some exemplary embodiments, the third material may include at least one metallic carbon nanotube.

The second and third materials may be coupled to each other by covalent bonds. Accordingly, each planar portion P1 and corresponding pillar portion P2 may be directly connected to each other, thereby serving as a source/drain region of the field effect transistor. Since the second and third materials are coupled to each other by the covalent bonds, the resulting structure may have high electrical and thermal conductivity. For example, compared with the case that the pad 111 and the contact 113 described with reference to FIGS. 2 and 3 are used, it is possible to improve electrical and thermal characteristics (e.g., resistance and heat dissipation) of the field effect transistor. Referring back to FIG. 6B, the planar portion P1 (e.g., made of the second material such as graphene) and the pillar portion P2 (e.g., made of the third material such as carbon nanotube) may be coupled to each other by covalent bonds.

Figure 7:
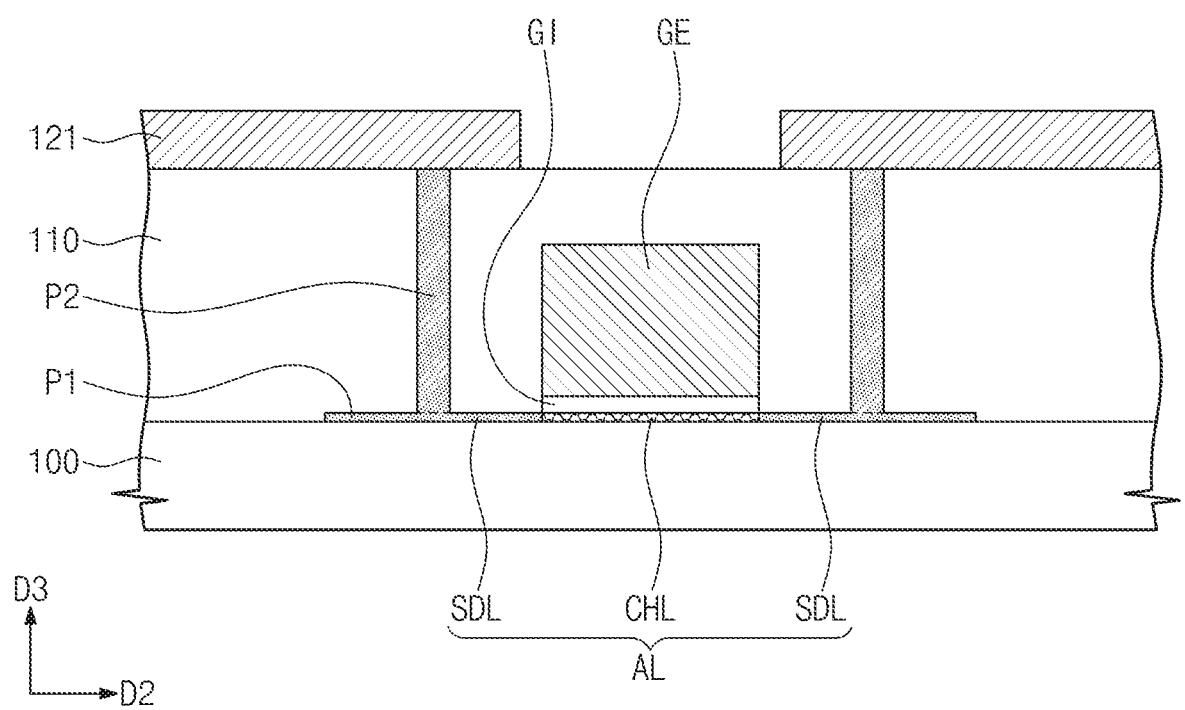
FIG. 7 is a sectional view illustrating a semiconductor device according to some exemplary embodiments.

FIG. 7 is a sectional view illustrating a semiconductor device according to some exemplary embodiments. In the following description, an element previously described with reference to FIGS. 2, 3, 6A, and 6B may be identified by a similar or identical reference number without repeating an overlapping description thereof.

Referring to FIG. 7, a semiconductor device including the field effect transistor of FIG. 6A may be provided. In some exemplary embodiments, the semiconductor device may include logic cells configured to process data, and the field effect transistor may be used to realize the logic cells.

An interlayered insulating layer 110 may be provided on a substrate 100 to cover an active layer AL and a gate electrode GE. Top surfaces of pillar portions P2 of source/drain layers SDL may be substantially coplanar with a top surface of the interlayered insulating layer 110. Interconnection lines 121 may be provided on the interlayered insulating layer 110 and may be electrically connected to the pillar portions P2, respectively. In other words, the interconnection lines 121 may be provided to allow electrical signals to be applied to the source/drain layers SDL.

Figure 8:
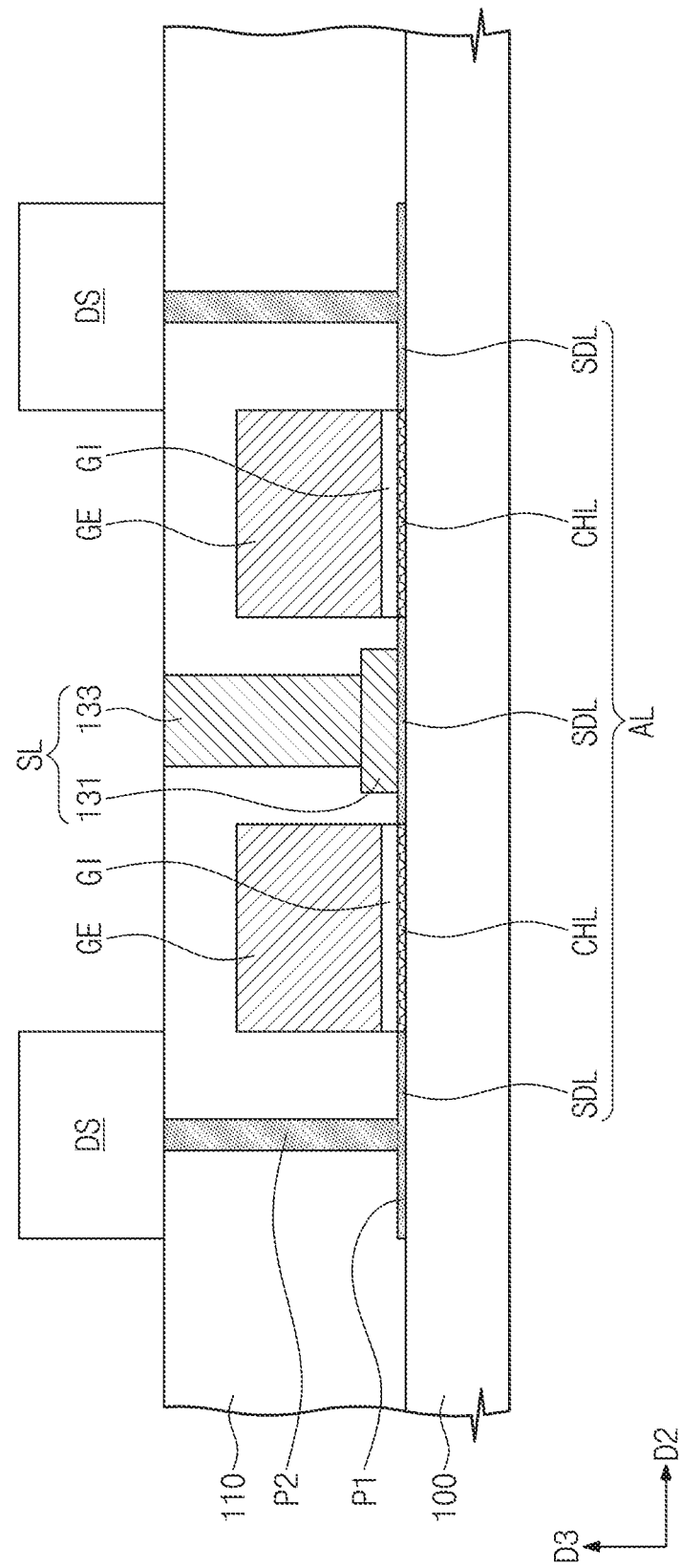
FIG. 8 is a sectional view illustrating a semiconductor device according to some exemplary embodiments.

FIG. 8 is a sectional view illustrating a semiconductor device according to some exemplary embodiments. In the following description, an element previously described with reference to FIGS. 4, 5, 6A, and 6B may be identified by a similar or identical reference number without repeating an overlapping description thereof.

Referring to FIG. 8, a semiconductor device including the field effect transistor of FIG. 6A may be provided. In some exemplary embodiments, the semiconductor device may include memory cells configured to store data, and the field effect transistor may be used to realize the memory cells.

An interlayered insulating layer 110 may be provided on a substrate 100 to cover an active layer AL, a source line SL, and a gate electrode GE. Each of source/drain layers SDL, which are provided at opposite ends of the active layer AL, may include a pillar portion P2. The pillar portions P2 may be provided to have top surfaces that are substantially coplanar with that of the interlayered insulating layer 110. Data storing elements DS may be provided on the interlayered insulating layer 110 and may be electrically connected to the pillar portions P2, respectively.

Although not shown, the source/drain layer SDL located between a pair of channel layers CHL may be provided to include the pillar portion P2. In this case, the source line SL may be omitted. A source interconnection line may be provided on the interlayered insulating layer 110 and may be electrically connected to the pillar portion P2.

Figure 9:
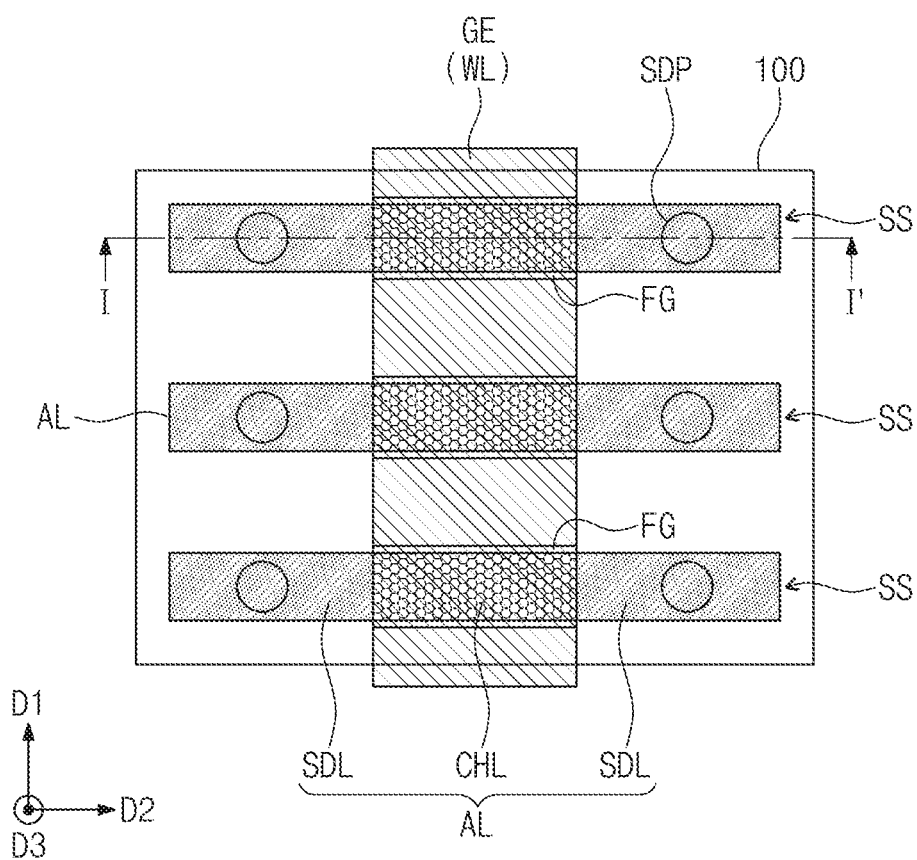
FIG. 9 is a plan view illustrating a semiconductor device according to some exemplary embodiments.
Figure 10:
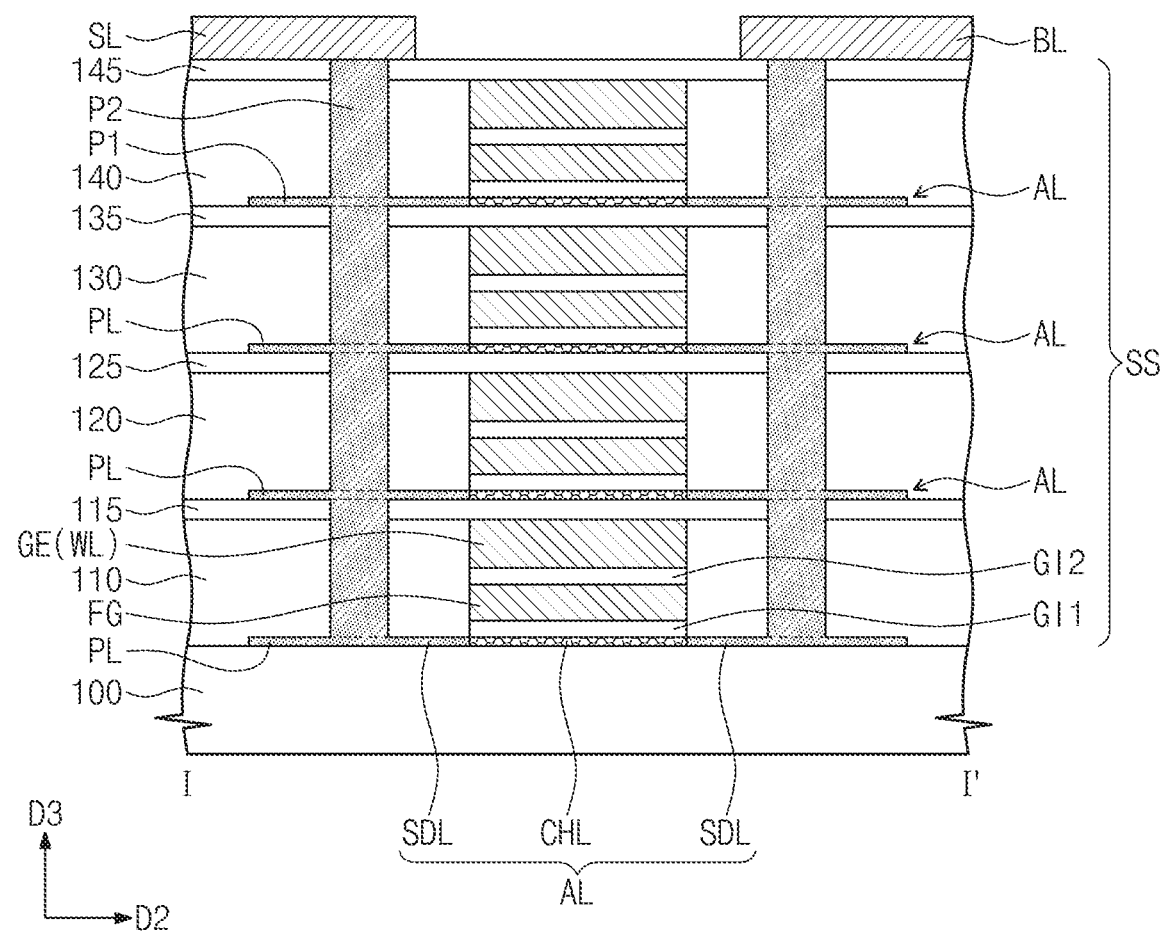
FIG. 10 is a sectional view taken along line I-I' of FIG. 9.

FIG. 9 is a plan view illustrating a semiconductor device according to some exemplary embodiments. FIG. 10 is a sectional view taken along line I-I' of FIG. 9. In the following description, an element previously described with reference to FIGS. 6A and 6B may be identified by a similar or identical reference number without repeating an overlapping description thereof.

Referring to FIGS. 9 and 10, a semiconductor device including the field effect transistor of FIG. 6A may be provided. In some exemplary embodiments, the semiconductor device may be a FLASH memory device.

A stack SS of vertically-stacked field effect transistors may be provided on a substrate 100. In some exemplary embodiments, a plurality of the stacks SS, which are spaced apart from each other in a first direction D1, may be provided on the substrate 100. However, for the sake of simplicity, the description that follows will refer to an example in which the stack SS is singly provided.

As shown in FIG. 10, the stack SS may include active layers AL that are stacked on the substrate 100 and are vertically spaced apart from each other. The active layers AL may be used as active regions of the field effect transistors constituting the stack SS. Each of the active layers AL may include source/drain layers SDL and a channel layer CHL therebetween.

First to fourth interlayered insulating layers 110, 120, 130, and 140 may be vertically stacked on the substrate 100. The lowermost one of the active layers AL may be interposed between the substrate 100 and the first interlayered insulating layer 110. Each of the remaining active layers AL may be interposed between a corresponding pair of the first to fourth interlayered insulating layers 110, 120, 130, and 140.

Each of the source/drain layers SDL may include a planar portion P1 for each of the active layers AL, and a pillar portion P2. Each of the pillar portions P2 of the source/drain layers SDL may be provided in a corresponding one of the first to fourth interlayered insulating layers 110, 120, 130, and 140. Each of the source/drain layers SDL may be provided in such a way that the pillar portion P2 is directly connected to another source/drain layer SDL that is positioned adjacent thereto in a vertical direction. The pillar portion P2 and the another source/drain layer SDL may be coupled to each other by covalent bonds. In other words, the source/drain layers SDL that are vertically stacked at a side of the stack SS may be electrically connected to each other through the pillar portions P2 thereof.

The stack SS may include floating gates FG, which are vertically stacked and spaced apart from each other, and gate electrodes GE, which are vertically stacked and spaced apart from each other. Each of the floating gates FG may be provided in a corresponding one of the first to fourth interlayered insulating layers 110, 120, 130, and 140, and each of the gate electrodes GE may be provided in a corresponding one of the first to fourth interlayered insulating layers 110, 120, 130, and 140. The floating gate FG and the gate electrode GE may be positioned on a corresponding one of the channel layers CHL. The floating gates FG may be configured to store electric charges. As an example, the floating gates FG may be formed of or include a doped semiconductor material (e.g., doped silicon, doped silicon-germanium, doped germanium, and so forth). The gate electrodes GE may serve as word lines WL of a FLASH memory device.

A plurality of the floating gates FG may be provided in each of the first to fourth interlayered insulating layers 110, 120, 130, and 140. When viewed in a plan view, the floating gates FG at the same level may be disposed to be overlapped with the channel layers CHL at the same level. In other words, the floating gates FG at the same level may be arranged along the channel layers CHL or in the first direction D1. The floating gates FG at the same level may be laterally spaced apart from each other.

By contrast, each of the gate electrodes GE may extend in the first direction D1. For example, in each of the first to fourth interlayered insulating layers 110, 120, 130, and 140, each of the gate electrodes GE may be provided to cross the channel layers CHL at the same level and the floating gates FG at the same level.

First gate dielectric layers GI1 may be respectively interposed between the channel layers CHL and the floating gates FG. Second gate dielectric layers GI2 may be respectively interposed between the floating gates FG and the gate electrodes GE. Each of the first gate dielectric layers GI1 may include a tunnel insulating layer (e.g., a silicon oxide layer). Each of the second gate dielectric layers GI2 may include a blocking insulating layer. For example, the blocking insulating layer may be formed of materials, whose dielectric constants are higher than that of the tunnel insulating layer. In some exemplary embodiments, the blocking insulating layer may include at least one of an ONO layer and a high-k dielectric layer (e.g., an aluminum oxide layer, a hafnium oxide layer, a hafnium aluminum oxide layer, or a zirconium oxide layer). Here, the ONO layer may refer to a stack of a silicon oxide layer, a silicon nitride layer, and a silicon oxide layer.

First to fourth insulating layers 115, 125, 135, and 145 may be provided on respective ones of the gate electrodes GE. Each of the first to fourth insulating layers 115, 125, 135, and 145 may be configured to allow the gate electrode GE thereunder to be electrically disconnected from the active layer AL thereon. Each of the first to fourth interlayered insulating layers 110, 120, 130, and 140 and the first to fourth insulating layers 115, 125, 135, and 145 may be formed of or include at least one of a silicon oxide layer, a silicon nitride layer, or a silicon oxynitride layer.

A source line SL and a bit line BL may be provided on the fourth insulating layer 145. The source line SL may be electrically connected to the source/drain layers SDL at a side of the stack SS. The bit line BL may be electrically connected to the source/drain layers SDL at an opposite side of the stack SS. In other words, the source line SL may serve as a common source of the field effect transistors of the stack SS, and the bit line BL may serve as a common drain of the field effect transistors of the stack SS.

In the semiconductor device according to the present exemplary embodiment, the active layer AL having a substantially two-dimensional or planar structure may be used as an active region of a FET. This use may make it possible to further provide an additional active layer AL on the interlayered insulating layer 110 covering the FET and consequently to easily realize an additional FET on the existing FET. By contrast, for a conventional silicon-based semiconductor device, a silicon layer or a silicon structure having a relatively large thickness may be used as an active region, and thus, it is difficult to realize a multi-layered FET structure. In other words, according to some exemplary embodiments, it is possible to more easily realize the multi-layered FET structure including a plurality of vertically-stacked FETs and thus, the semiconductor device can be fabricated to have an increased integration density.

Figure 11:
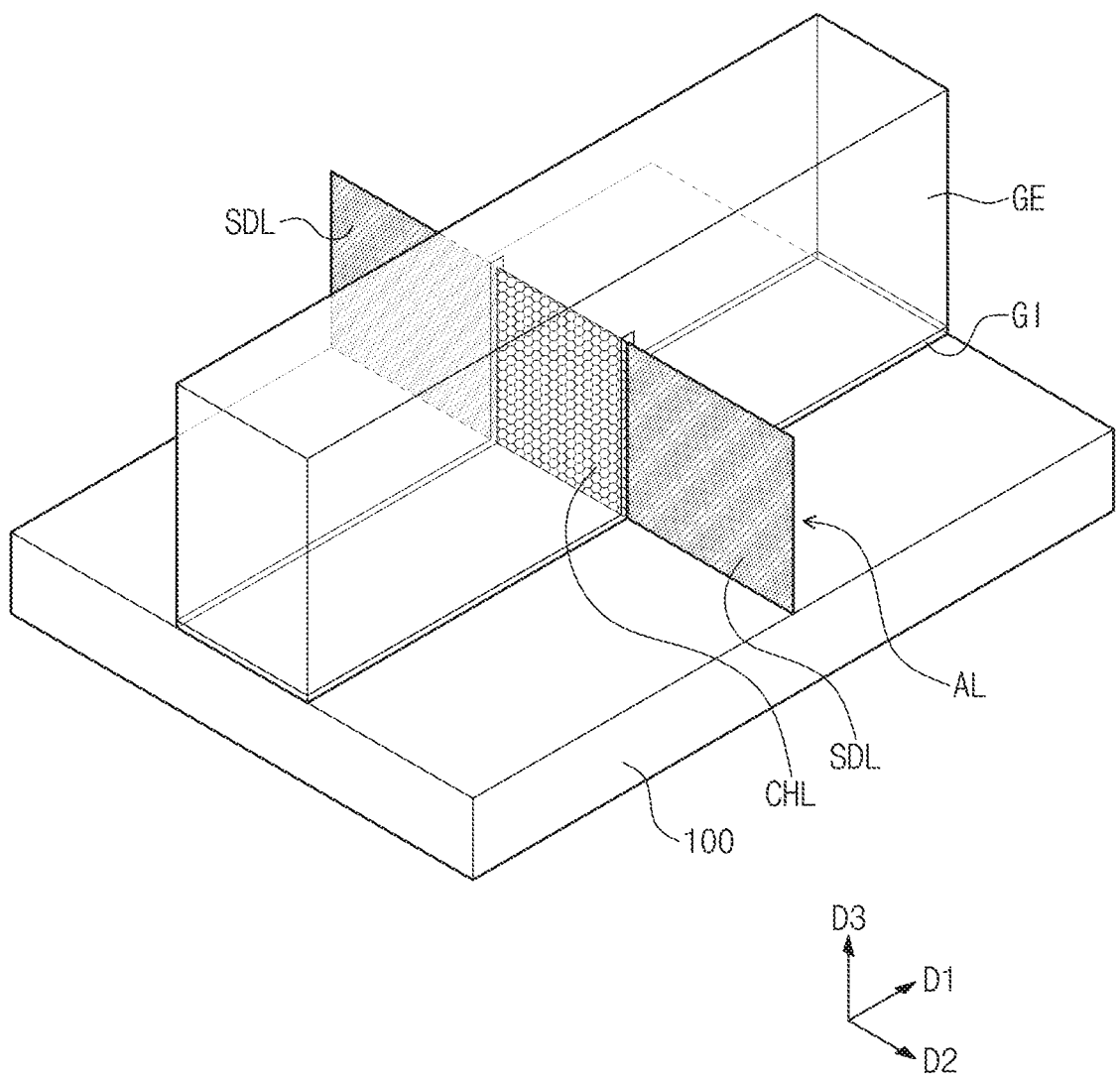
FIG. 11 is a perspective view illustrating a semiconductor device according to some exemplary embodiments.

FIG. 11 is a perspective view illustrating a semiconductor device according to some exemplary embodiments. In the following description of the present embodiment, an element previously described with reference to FIGS. 1A and 1B may be identified by a similar or identical reference number without repeating an overlapping description thereof.

Referring to FIG. 11, a field effect transistor including an active layer AL and a gate electrode GE may be provided on a substrate 100. The active layer AL may be provided in such a way that a normal direction thereof is perpendicular to a top surface of the substrate 100 (i.e., in a third direction D3). In other words, the active layer AL may be a fin-shaped structure perpendicularly protruding from the substrate 100. Here, a channel layer CHL of the active layer AL may have opposite surfaces that are exposed above the substrate 100.

The gate electrode GE may be provided to extend in a first direction D1 and cross the channel layer CHL. In some exemplary embodiments, the gate electrode GE may be provided to face both of the opposite surfaces of the channel layer CHL. In other words, this structure may make it possible to realize a double gate effect that is equivalent to providing two gate electrodes on and under a channel region.

For a fin-FET with a conventional silicon fin channel pattern, a top of the channel pattern is a two-dimensional surface which may be used as a path of a leakage current. However, for the semiconductor device according to the present exemplary embodiment, a top of the channel layer CHL is shaped like a one-dimensional line, not the two-dimensional surface, and thus, it is possible to prevent the leakage current, which may occur in the conventional silicon fin-FET.

Figure 12:
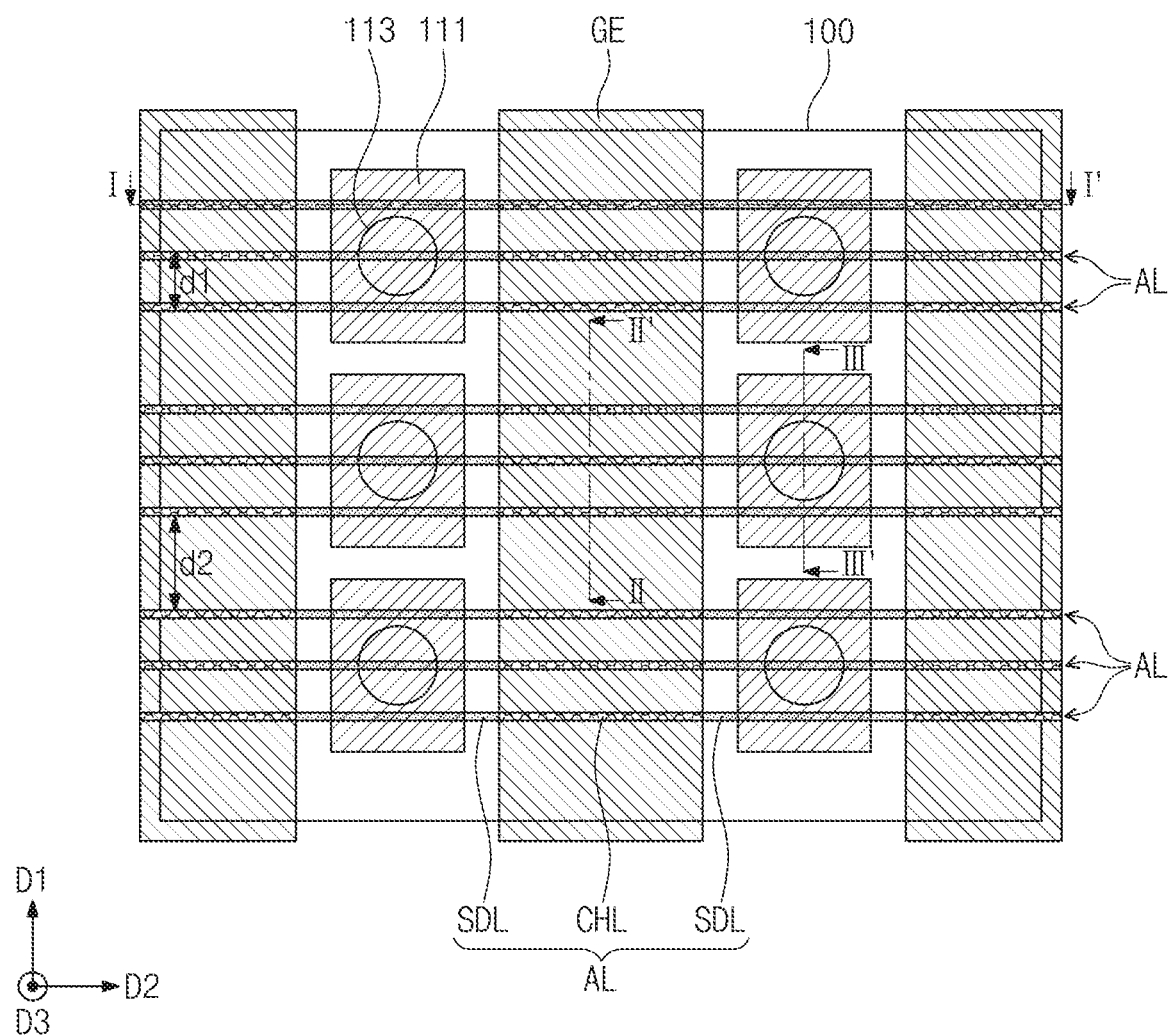
FIG. 12 is a plan view illustrating a semiconductor device according to some exemplary embodiments.
Figure 13A:
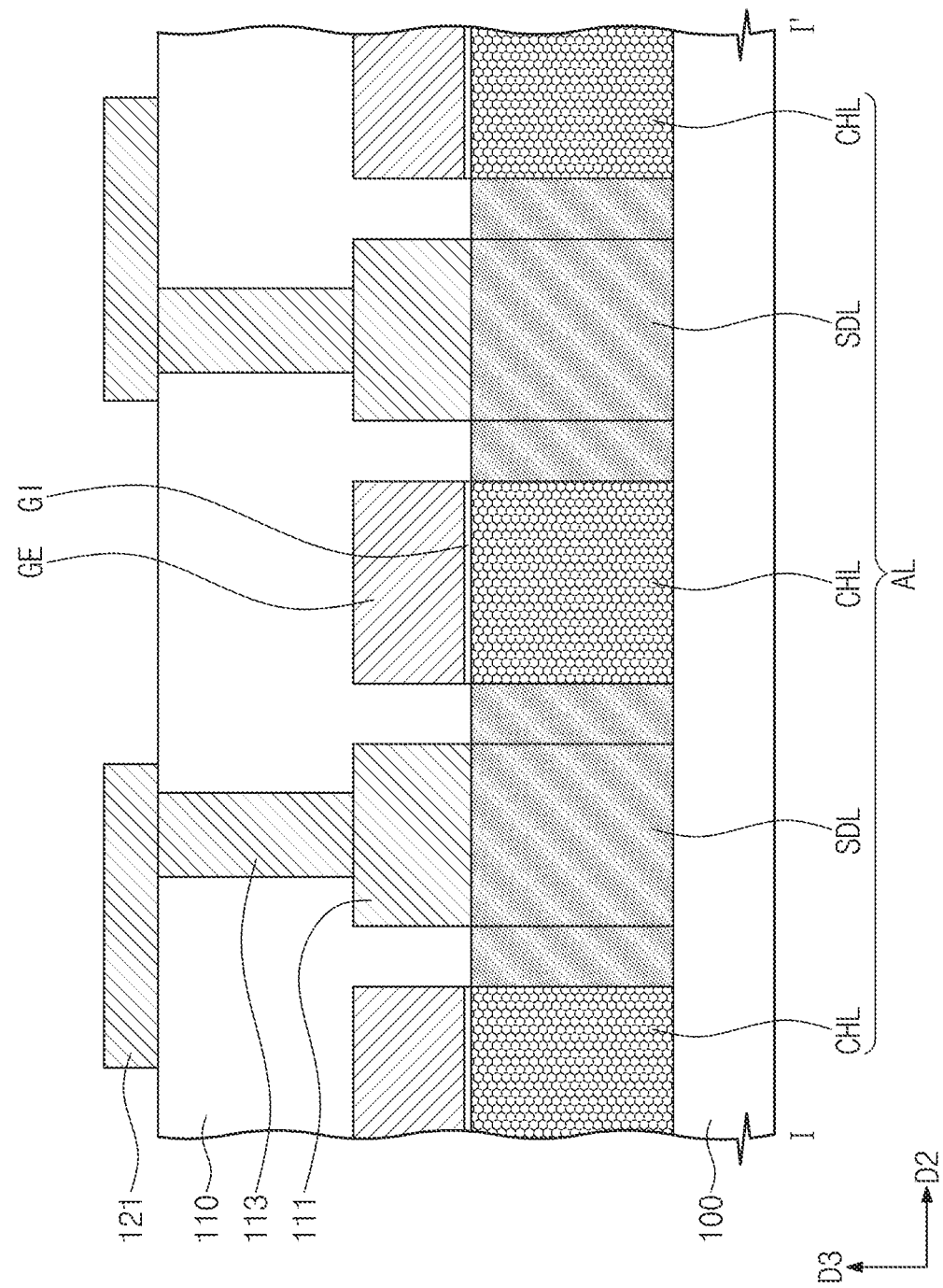
FIGS. 13A, 13B, and 13C are sectional views taken along lines I-I', and respectively, of FIG. 12.
Figure 13B:
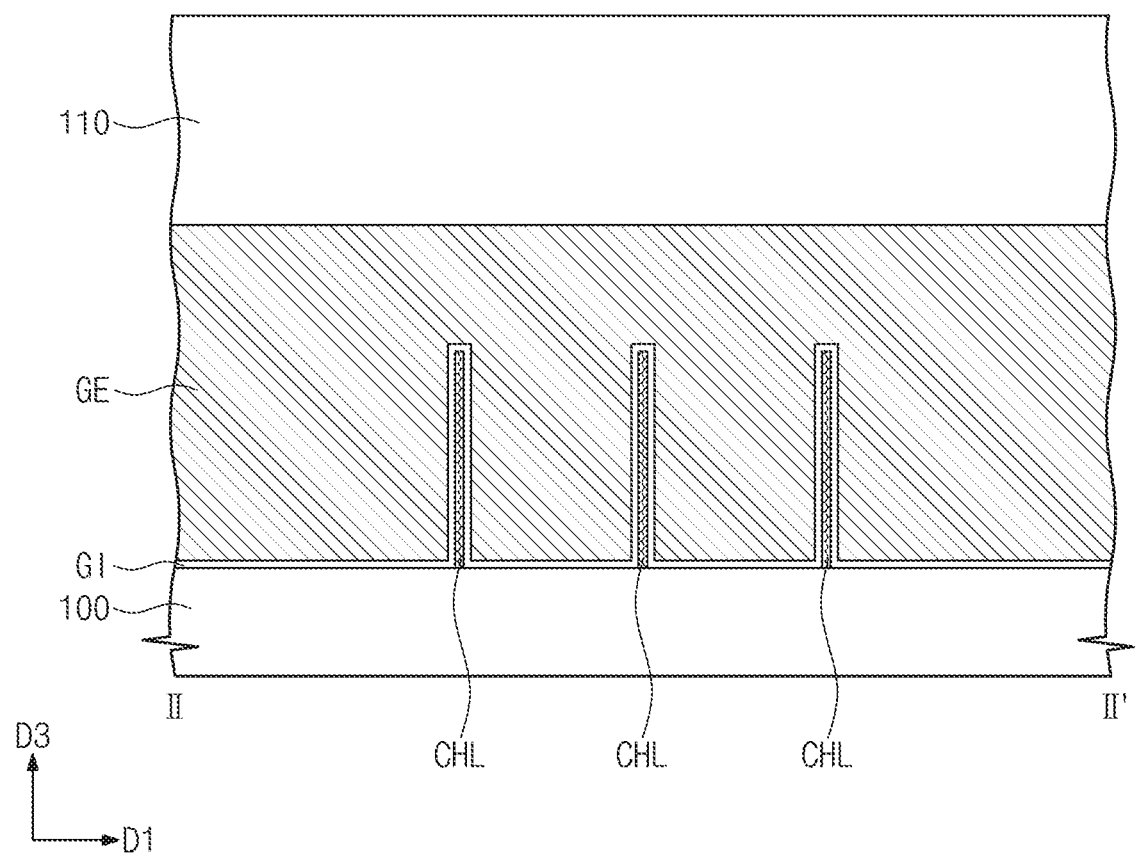
Figure 13C:
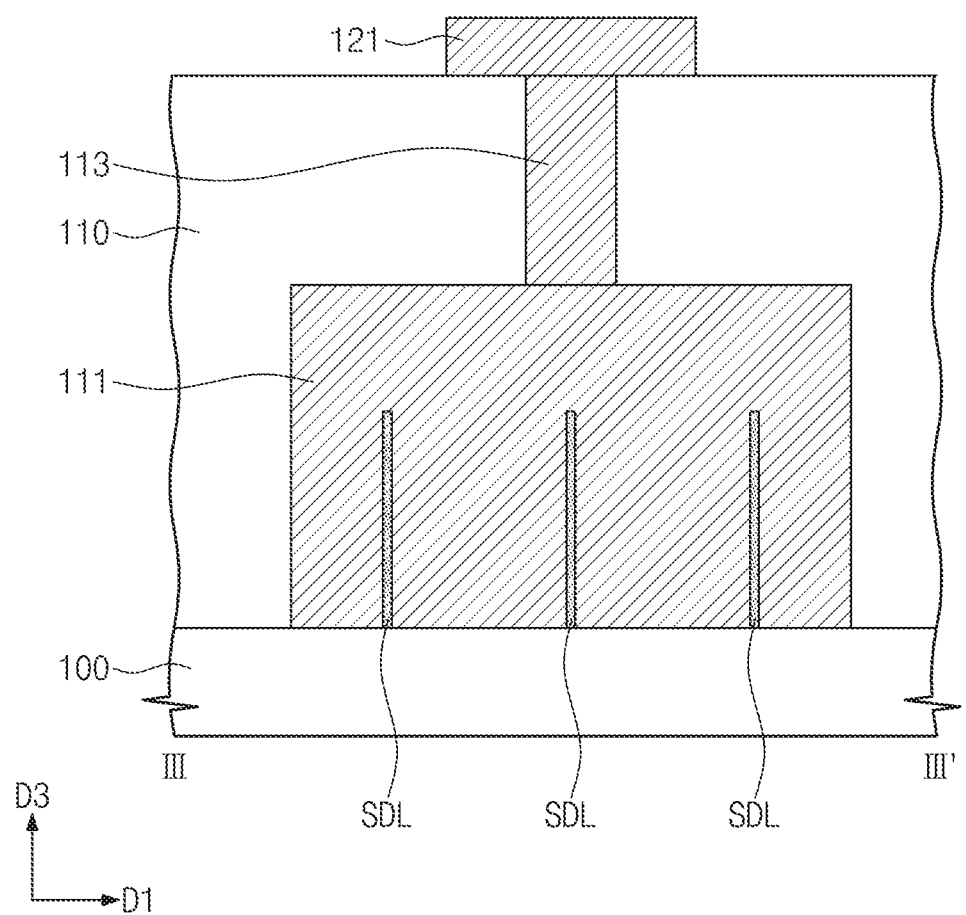

FIG. 12 is a plan view illustrating a semiconductor device according to some exemplary embodiments. FIGS. 13A, 13B, and 13C are sectional views taken along lines I-I', and respectively, of FIG. 12. In the following description, an element previously described with reference to FIGS. 2, 3, and 11 may be identified by a similar or identical reference number without repeating an overlapping description thereof.

Referring to FIGS. 12 and 13A to 13C, a semiconductor device including the field effect transistor of FIG. 11A may be provided. In some exemplary embodiments, the semiconductor device may include logic cells configured to process data, and the field effect transistor may be used to realize the logic cells.

Fin-shaped active layers AL may be provided on a substrate 100 to extend orthogonal to the substrate 100 in a third direction D3 and to be arranged on the substrate 100 in a first direction D1. Referring to FIG. 12, the active layers AL may be provided to be spaced apart from each other by at least two different distances in the first direction D1. For example, in the exemplary embodiment shown in FIG. 12, three groups of three active layers AL are shown. The three active layers AL of each group are spaced apart by a distance d1, and the groups of active layers AL are spaced apart by a distance d2. The distance d2 may be greater than the distance d1. However, this is only an example, and there may be greater or fewer than three active layers AL per group, and there may be greater or fewer than three groups. Also, the example of FIG. 12 shows three active layers AL in each group that are uniformly spaced apart by the distance d1. However, this is only an example, and the active layers AL may be spaced apart by different distances. Similarly, the groups of active layers AL shown in FIG. 12 are shown as uniformly spaced apart by the distance d2. However, the groups of active layers AL may be spaced apart by different distances. The active layers AL may extend in a second direction D2 crossing the first direction D1 and may be parallel to each other.

Gate electrodes GE may be provided to cross channel layers CHL of the active layers AL in common. The gate electrodes GE may extend in the first direction D1 and may be parallel to each other. The gate electrodes GE may be spaced apart from each other in the second direction D2.

Pads 111 may be provided to cover source/drain layers SDL of the active layers AL. Each of the pads 111 may be provided to commonly cover the source/drain layers SDL that are adjacent to each other in the first direction D1. Contacts 113 may be provided on the pads 111, respectively.

Interconnection lines 121 (see FIG. 13A) may be provided on an interlayered insulating layer 110 on the substrate 100. The interconnection lines 121 may be electrically connected to the contacts 113, respectively. In other words, the interconnection lines 121 may be provided to allow electrical signals to be applied to the source/drain layers SDL.

Figure 14:
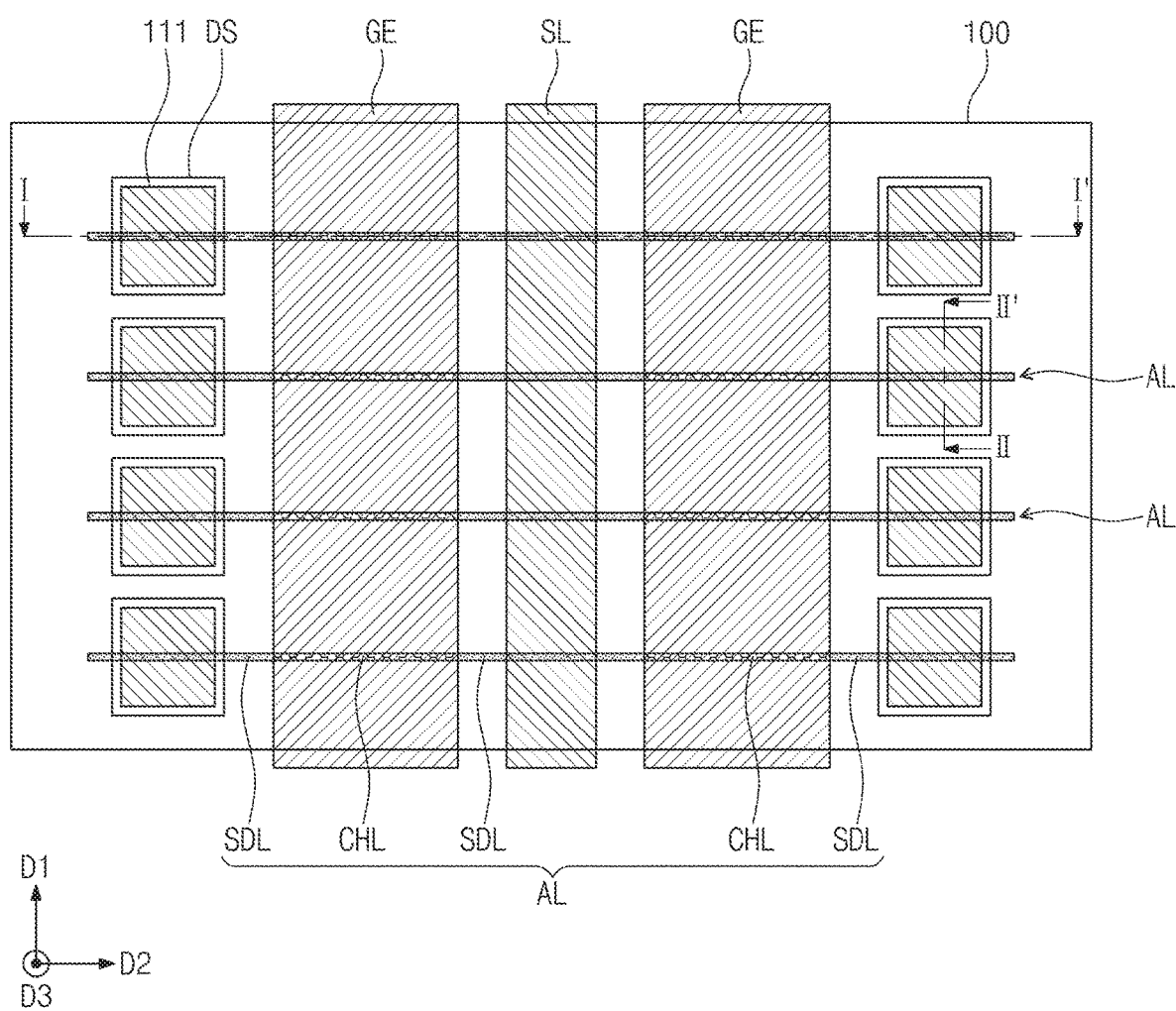
FIG. 14 is a plan view illustrating a semiconductor device according to some exemplary embodiments.
Figure 15A:
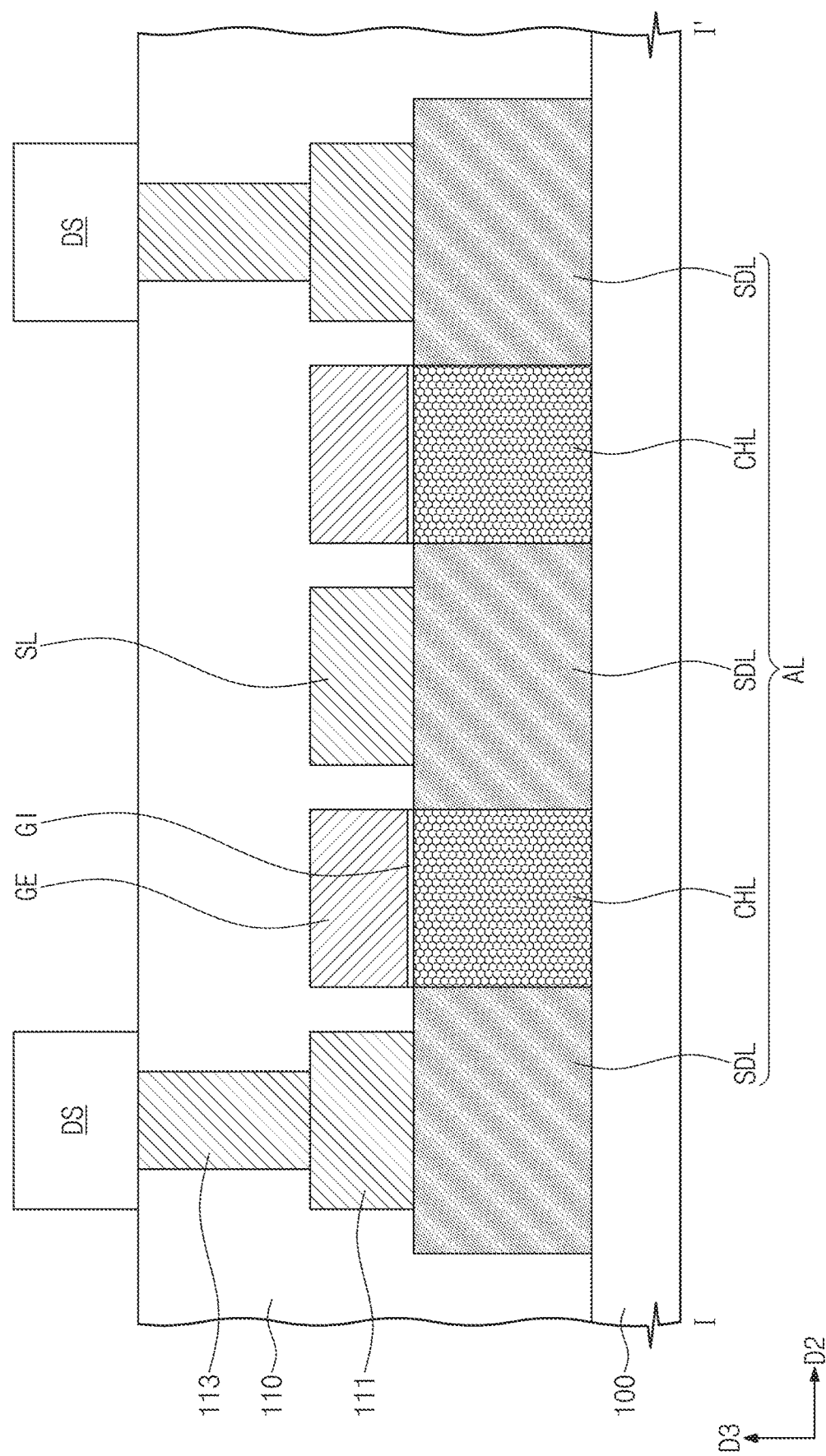
FIGS. 15A and 15B are sectional views taken along lines I-I' and respectively, of FIG. 14.
Figure 15B:
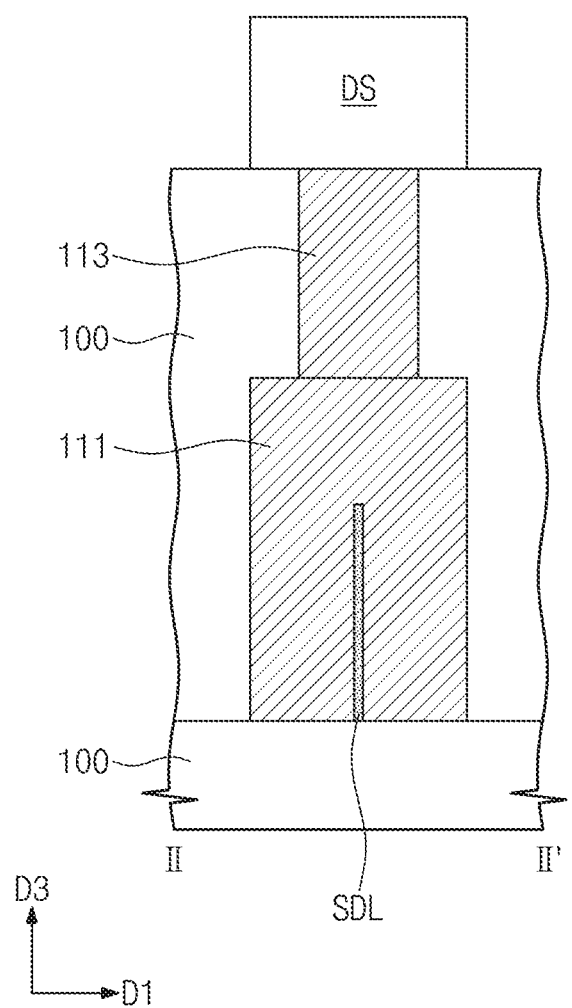

FIG. 14 is a plan view illustrating a semiconductor device according to some exemplary embodiments. FIGS. 15A and 15B are sectional views taken along lines I-I' and respectively, of FIG. 14. In the following description, an element previously described with reference to FIGS. 4, 5, and 11 may be identified by a similar or identical reference number without repeating an overlapping description thereof.

Referring to FIGS. 14, 15A, and 15B, a semiconductor device including the field effect transistor of FIG. 11 may be provided. In some exemplary embodiments, the semiconductor device may include memory cells configured to store data, and the field effect transistor may be used to realize the memory cells.

Fin-shaped active layers AL may be provided on a substrate 100 to extend orthogonally to the substrate 100 in a third direction D3 and be arranged on the substrate 100 in a first direction D1. The active layers AL may extend in a second direction D2 crossing the first direction D1 and may be parallel to each other.

Gate electrodes GE may be provided to commonly cross channel layers CHL of the active layers AL. The gate electrodes GE may extend in the first direction D1 and may be parallel to each other. A source line SL may be provided between a pair of the gate electrodes GE to extend in the first direction D1 and to commonly cross source/drain layers SDL of the active layers AL. The source line SL may be provided to directly cover the source/drain layers SDL and may be electrically connected to the source/drain layers SDL.

Pads 111 may be provided to cover the source/drain layers SDL, respectively, which are positioned at opposite ends of each of the active layers AL. Contacts 113 may be provided on the pads 111, respectively. Data storing elements DS may be provided on an interlayered insulating layer 110 on the substrate 100, and the data storing elements DS may be electrically connected to the contacts 113, respectively.

Figure 16:
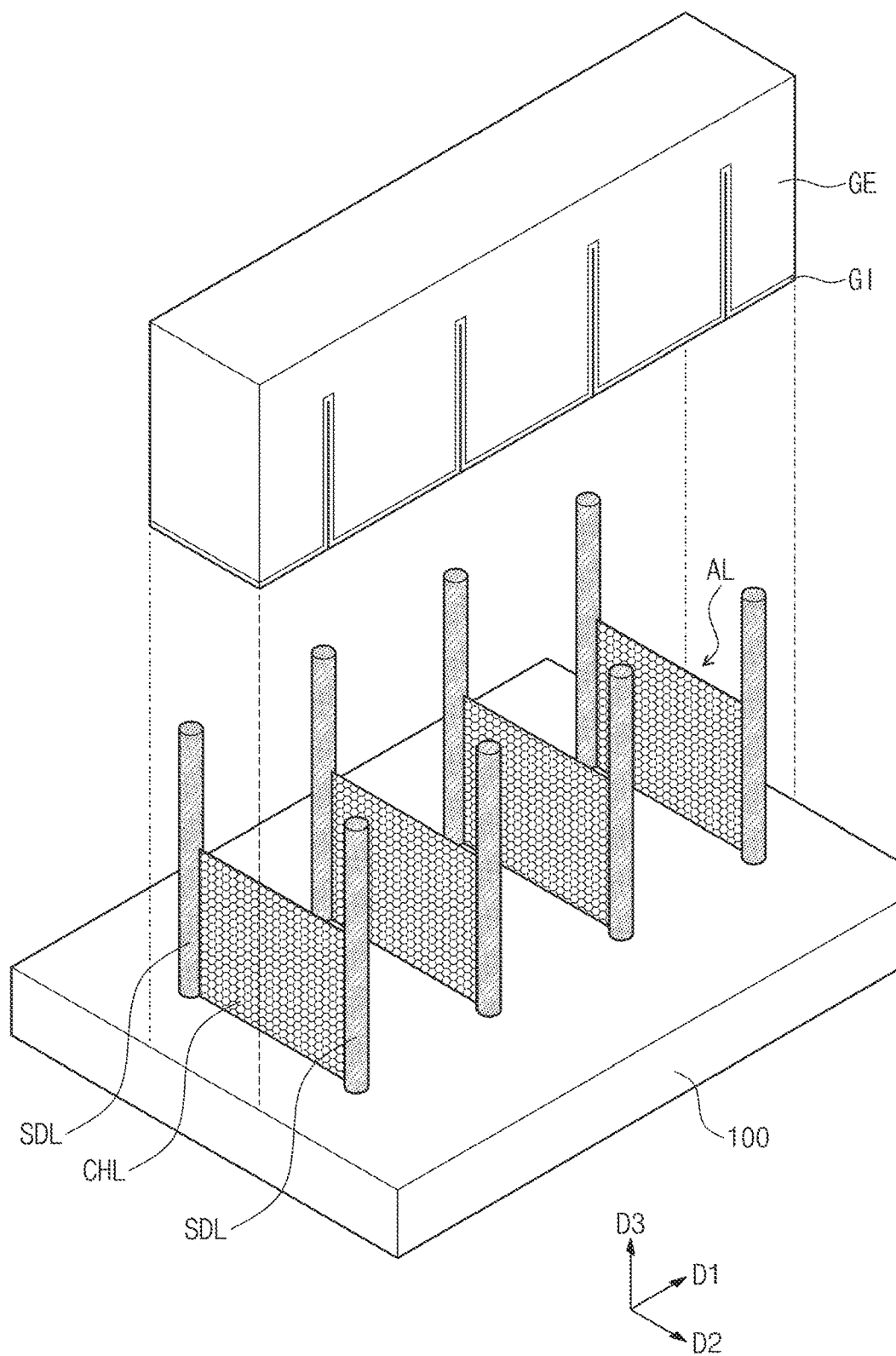
FIG. 16 is a perspective view illustrating a semiconductor device according to some exemplary embodiments.

FIG. 16 is a perspective view illustrating a semiconductor device according to some exemplary embodiments. In the following description, an element previously described with reference to FIG. 11 may be identified by a similar or identical reference number without repeating an overlapping description thereof.

Referring to FIG. 16, a plurality of active layers AL may be provided on a substrate 100 and may be arranged in a first direction D1. Each of the active layers AL may include a fin-shaped channel layer CHL extending orthogonally to the substrate 100 in a third direction D3 and source/drain layers SDL at both sides of the channel layer CHL.

Each of the source/drain layers SDL may be configured to have substantially the same features as the pillar portion P2 previously described with reference to FIGS. 6A and 6B. In other words, the planar portions P1 may be omitted in the source/drain layer SDL previously described with reference to FIGS. 6A and 6B. The source/drain layer SDL may be directly connected to the active layer AL by covalent bonds. For example, the source/drain layer SDL may be a carbon nanotube.

A gate electrode GE may be provided to extend on the substrate 100 in the first direction D1 and along the channel layers CHL. The gate electrode GE may include portions positioned between the channel layers CHL. For example, the portions of the gate electrode GE may be provided to face opposite faces of the channel layer CHL.

Figure 17:
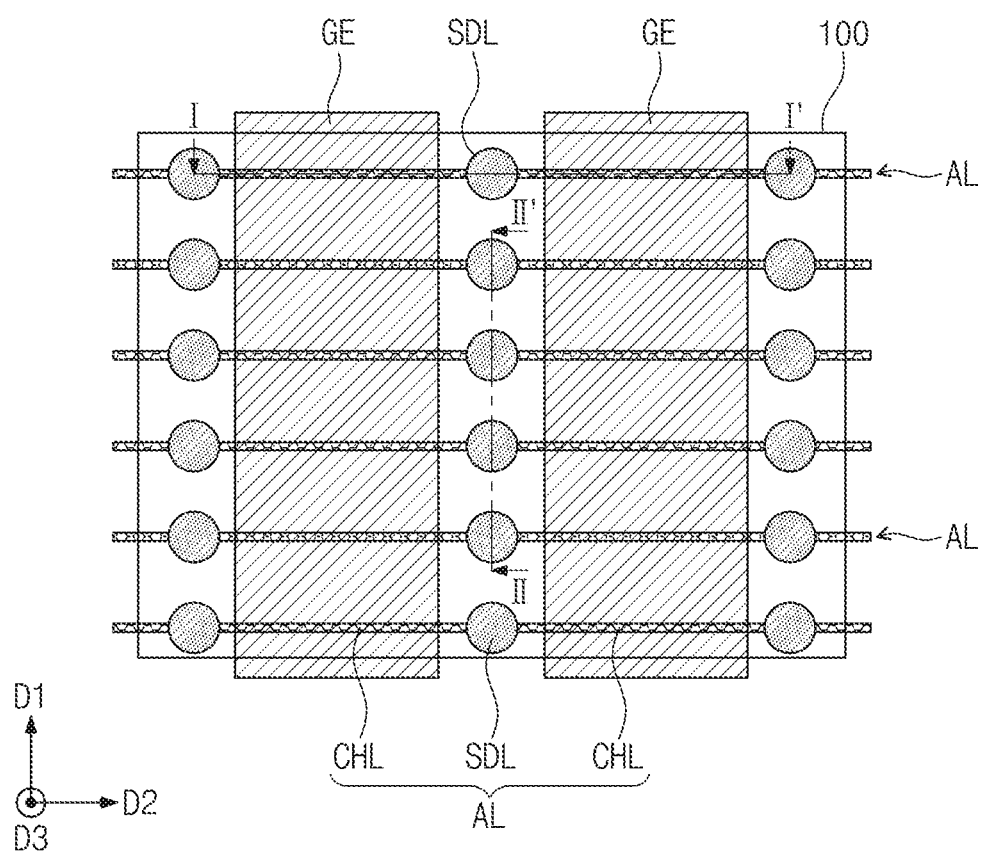
FIG. 17 is a plan view illustrating a semiconductor device according to some exemplary embodiments.
Figure 18A:
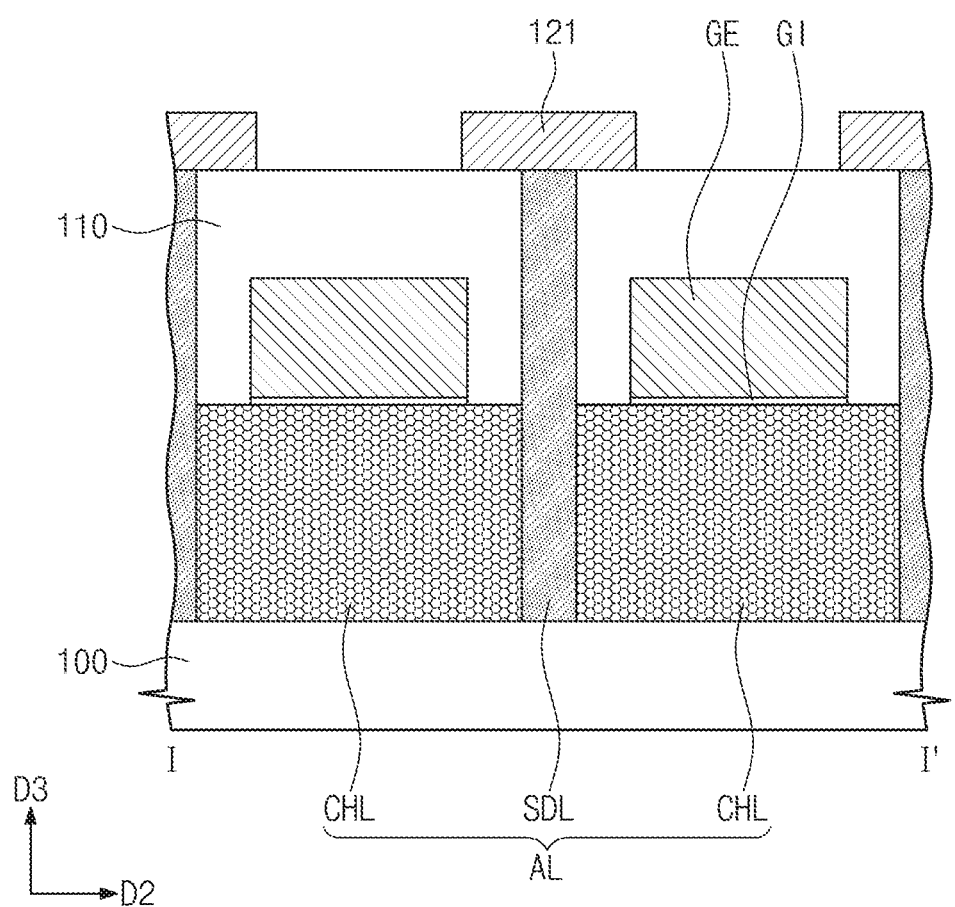
FIGS. 18A and 18B are sectional views taken along lines I-I' and respectively, of FIG. 17.
Figure 18B:
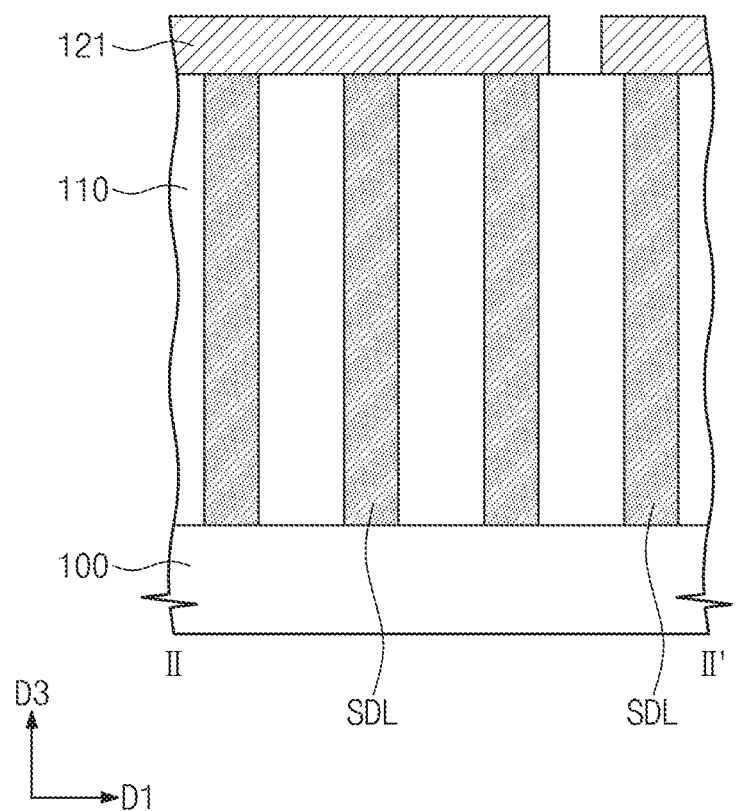

FIG. 17 is a plan view illustrating a semiconductor device according to some exemplary embodiments. FIGS. 18A and 18B are sectional views taken along lines I-I' and respectively, of FIG. 17. In the following description, an element previously described with reference to FIGS. 13A to 13C and 16 may be identified by a similar or identical reference number without repeating an overlapping description thereof.

Referring to FIGS. 17, 18A, and 18B, a semiconductor device including the field effect transistor of FIG. 16 may be provided. In some exemplary embodiments, the semiconductor device may include logic cells configured to process data, and the field effect transistor may be used to realize the logic cells.

A plurality of active layers AL may be arranged in a first direction D1 on a substrate 100. Each of the active layers AL may include channel layers CHL, which are arranged in a second direction D2, and source/drain layers SDL, which are provided between the channel layers CHL. Here, the source/drain layers SDL may be configured to have substantially the same features as the pillar portion P2 previously described with reference to FIGS. 6A and 6B. Each of the source/drain layers SDL may function as the pad 111 and the contact 113 previously described with reference to FIGS. 12 and 13A to 13C.

Interconnection lines 121 (see FIGS. 18A and 18B) may be provided on an interlayered insulating layer 110 on the substrate 100. The interconnection lines 121 may be electrically connected to the source/drain layers SDL.

Figure 19:
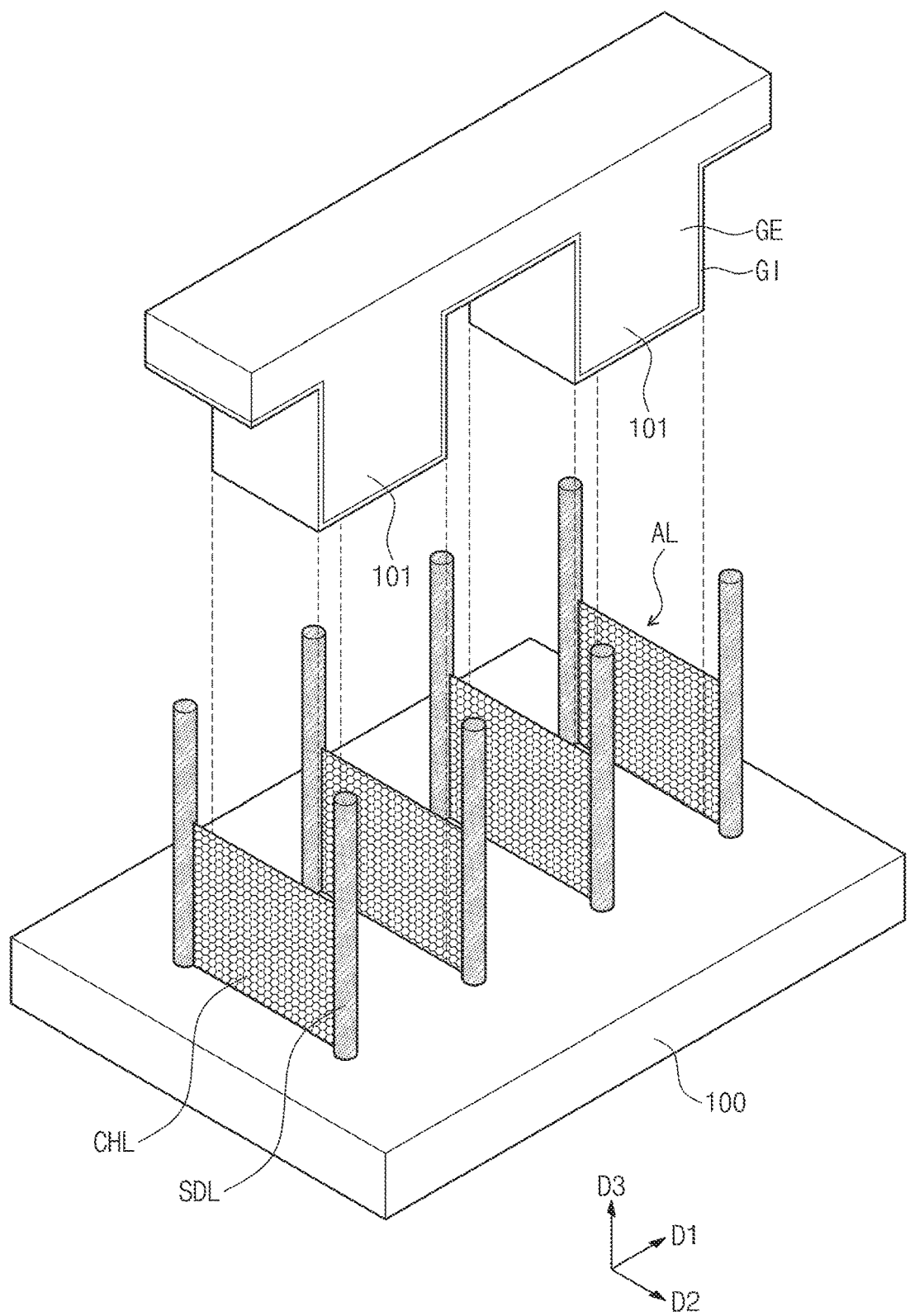
FIG. 19 is a perspective view illustrating a semiconductor device according to some exemplary embodiments.

FIG. 19 is a perspective view illustrating a semiconductor device according to some exemplary embodiments. In the following description, an element previously described with reference to FIG. 16 may be identified by a similar or identical reference number without repeating an overlapping description thereof.

Referring to FIG. 19, a gate electrode GE may be provided to extend on the substrate 100 in a first direction D1 and cross channel layers CHL. Unlike that of FIG. 16, the gate electrode GE may include at least one portion 101 positioned between a pair of channel layers CHL. In other words, such a portion 101 of the gate electrode GE may be provided to be adjacent to one of opposite surfaces of each channel layer CHL. The other of the opposite surfaces of each channel layer CHL may not be adjacent to the gate electrode GE. The change in the structure of the gate electrode GE may make it possible to control a saturation current (Idsat) value of a field effect transistor. For example, the field effect transistor according to the exemplary embodiment shown in FIG. 19 may have a saturation current (Idsat) value that is smaller than that of the field effect transistor previously described with reference to FIG. 16.

Figure 20:
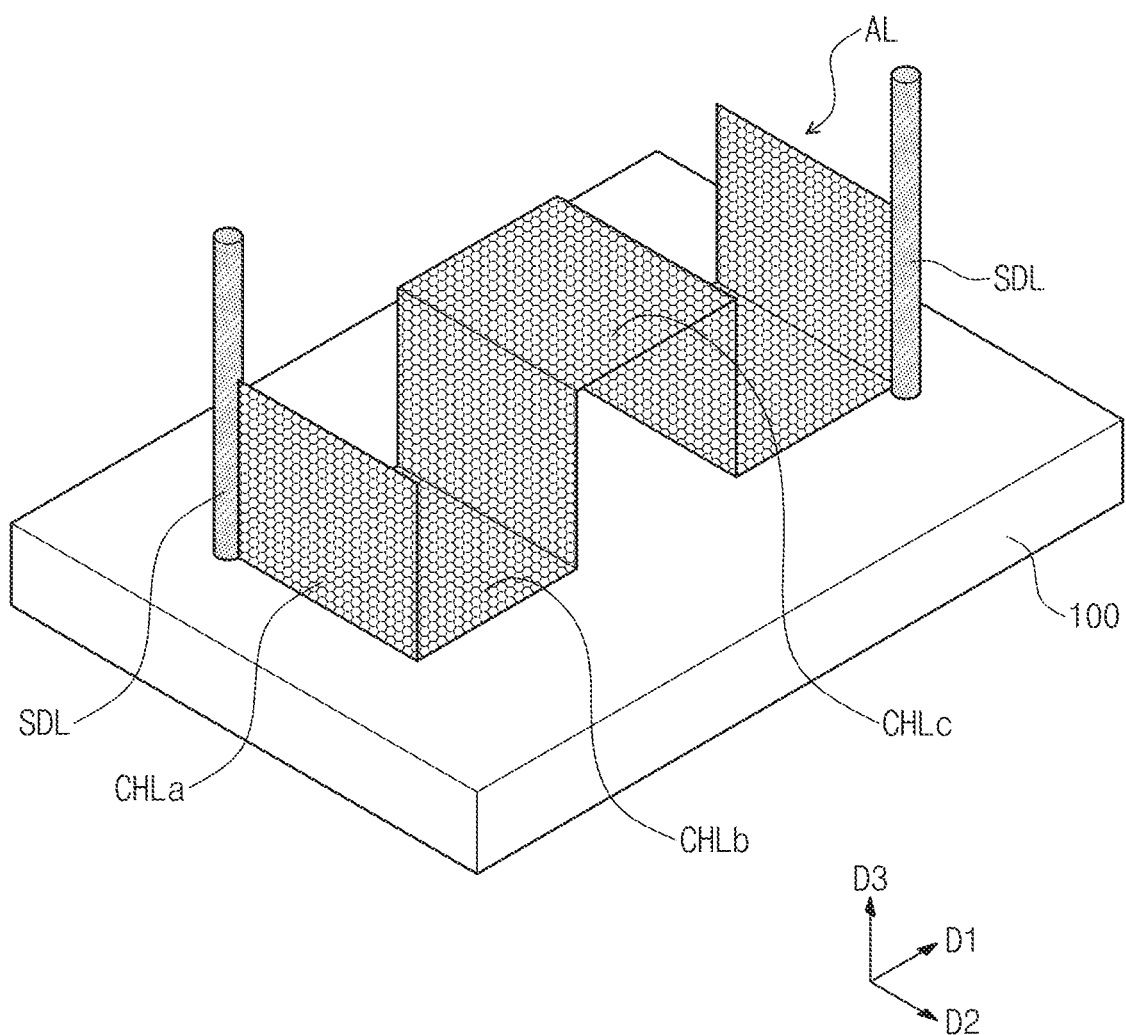
FIG. 20 is a perspective view illustrating a semiconductor device according to some exemplary embodiments.

FIG. 20 is a perspective view illustrating a semiconductor device according to some exemplary embodiments. In the following description, an element previously described with reference to FIG. 16 may be identified by a similar or identical reference number without repeating an overlapping description thereof.

Referring to FIG. 20, a channel layer CHL may include one or more portions that extend on the substrate 100 in a first direction D1. The channel layer CHL may include first portions CHLa, second portions CHLb, and a third portion CHLc. Each of the first portions CHLa may have a fin-shaped structure extending orthogonally from the substrate 100 and parallel to a third direction D3. The second portions CHLb and the third portion CHLc may be provided to have a surface parallel to a top surface of the substrate 100. The second portions CHLb may be provided to be adjacent to bottoms of the first portions CHLa, and the third portion CHLc may be provided to be adjacent to tops of the first portions CHLa. In other words, the second portions CHLb may be positioned at a level lower than that of the third portion CHLc.

The first portions CHLa, the second portions CHLb, and the third portion CHLc may be connected to each other to form a single body. The second portion CHLb may be interposed between a pair of the first portions CHLa, and the third portion CHLc may be interposed between another pair of the first portions CHLa. In other words, when viewed in a vertical section taken along the first direction D1, the channel layer CHL may have a zigzag shape.

A source/drain layer SDL may be electrically connected to an end portion of the channel layer CHL, and another source/drain layer SDL may be electrically connected to an opposite end portion of the channel layer CHL, as shown in FIG. 20. Each of the source/drain layers SDL may be configured to have substantially the same features as the pillar portion P2 previously described with reference to FIGS. 6A and 6B. As an example, the source/drain layer SDL may be provided in the form of a carbon nanotube.

For example, the source/drain layer SDL may be used as a source electrode of a field effect transistor, and the another source/drain layer SDL may be used as a drain electrode of the field effect transistor. The channel layer CHL between the source/drain layers SDL may be used as a channel region of the field effect transistor. In certain exemplary embodiments, unlike that of FIG. 16, one or more portions of the channel layer CHL may extend in the first direction and may be used as a single channel region of a single field effect transistor. In other words, the field effect transistor according to the exemplary embodiment shown in FIG. 20 may have a long channel, when compared with the field effect transistor shown in FIG. 16. Since the channel layer CHL includes the first portions CHLa, it is possible to achieve the afore-described double gate effect.

Although not shown, a gate electrode GE may be provided to extend on the substrate 100 in the first direction D1 or along the channel layer CHL. For example, the gate electrode GE may be configured to have similar technical features to those of the gate electrode GE previously described with reference to FIG. 19. In certain exemplary embodiments, the gate electrode GE may be provided to have a portion positioned below the third portion CHLc, and this may make it possible to achieve the double gate effect.

Figure 21:
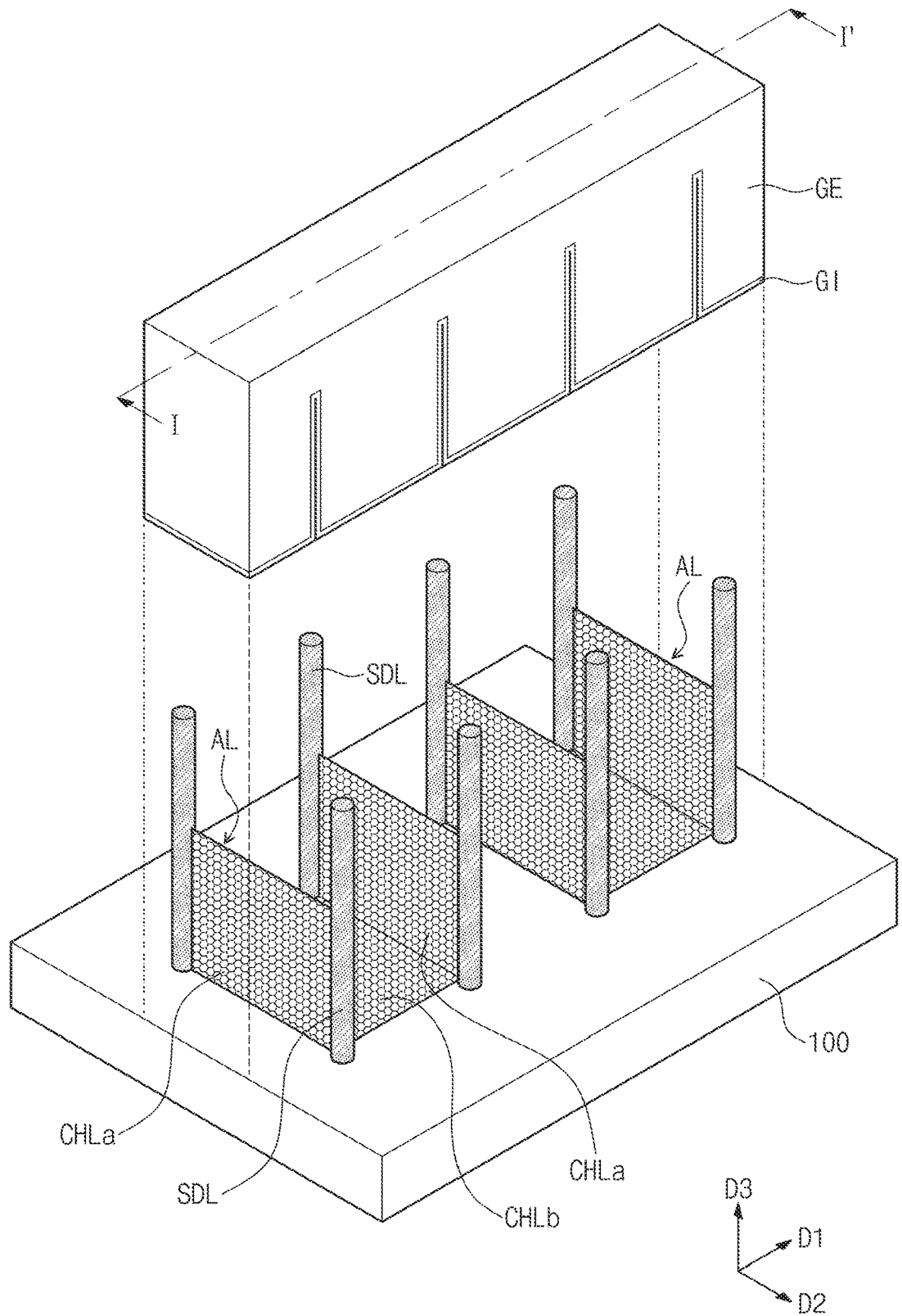
FIG. 21 is a perspective view illustrating a semiconductor device according to some exemplary embodiments.

FIG. 21 is a perspective view illustrating a semiconductor device according to some exemplary embodiments. In the following description, an element previously described with reference to FIG. 16 may be identified by a similar or identical reference number without repeating an overlapping description thereof.

Referring to FIG. 21, a plurality of active layers AL may be arranged in a first direction D1 on a substrate 100. Each of channel layers CHL may include a pair of first portions CHLa and a second portion CHLb interposed between the pair of first portions CHLa. Each of the first portions CHLa may have a fin-shaped structure extending orthogonally to the substrate 100 and parallel to a third direction D3. The second portion CHLb may be provided to have a surface parallel to a top surface of the substrate 100. The second portion CHLb may be provided adjacent to bottoms of the first portions CHLa.

The first portions CHLa and the second portion CHLb may be connected to each other to form a single body (i.e., the channel layer CHL). When viewed in a vertical section taken along the first direction D1, the channel layer CHL may be shaped like a letter 'U'.

Source/drain layers SDL may be electrically connected to each of the channel layers CHL. Each of the source/drain layers SDL may be configured to have substantially the same features as the pillar portion P2 previously described with reference to FIGS. 6A and 6B. As an example, the source/drain layer SDL may be provided in the form of a carbon nanotube. The first portion CHLa between a pair of the source/drain layers SDL may be used as a channel region of the field effect transistor. In such a case, the second portion CHLb does not have a function as the channel region.

A gate electrode GE may be provided to extend on the substrate 100 in the first direction D1 and along the channel layers CHL.

FIGS. 22A to 22F are sectional views illustrating a method of fabricating a semiconductor device, according to some exemplary embodiments. For example, a method illustrated in FIGS. 22A to 22F may be used to fabricate the semiconductor device of FIG. 21. That is, FIGS. 22A to 22F are sectional views that are taken along line I-I' of FIG. 21.

Figure 22A:
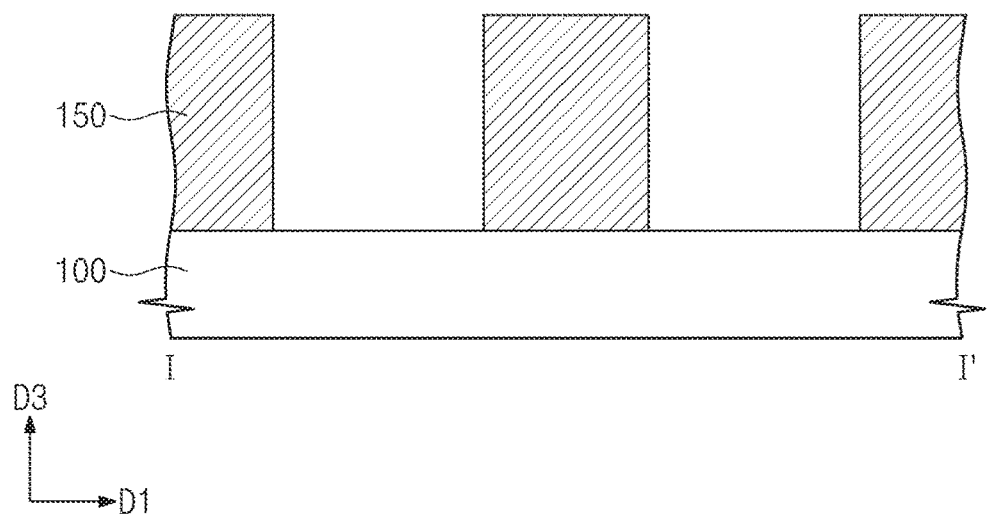
FIGS. 22A through 22F are sectional views illustrating a method of fabricating a semiconductor device, according to some exemplary embodiments.

Referring to FIGS. 21 and 22A, first conductive patterns 150 may be formed on a substrate 100 and may be arranged in a first direction D1. For example, the first conductive patterns 150 may be formed of or include at least one of conductive materials (e.g., doped semiconductors, metals, conductive metal nitrides, or metal-semiconductor compounds).

Figure 22B:
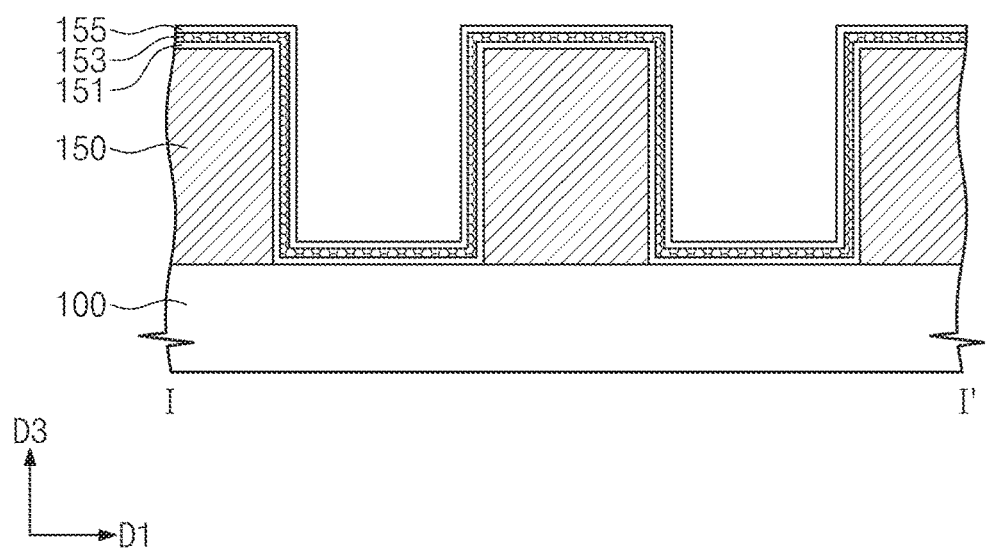

Referring to FIGS. 21 and 22B, a first dielectric layer 151, a preliminary channel layer 153, and a second dielectric layer 155 may be sequentially formed to cover the first conductive patterns 150. The first dielectric layer 151, the preliminary channel layer 153, and the second dielectric layer 155 may be formed to extend in the first direction D1 or along the first conductive patterns 150. Thereafter, a plurality of source/drain layers SDL may be formed to be electrically connected to the preliminary channel layer 153. As another example, the source/drain layers SDL may be formed after a subsequent process for forming a gate electrode GE, but the inventive concept may not be limited thereto.

The first and second dielectric layers 151 and 155 may be formed of a high-k dielectric material, and a channel layer CHL may be formed to include a two-dimensional atomic layer made of a first material. Each of the source/drain layers SDL may have a two-dimensional atomic layer and may be formed of a second material and/or a third material.

Figure 22C:
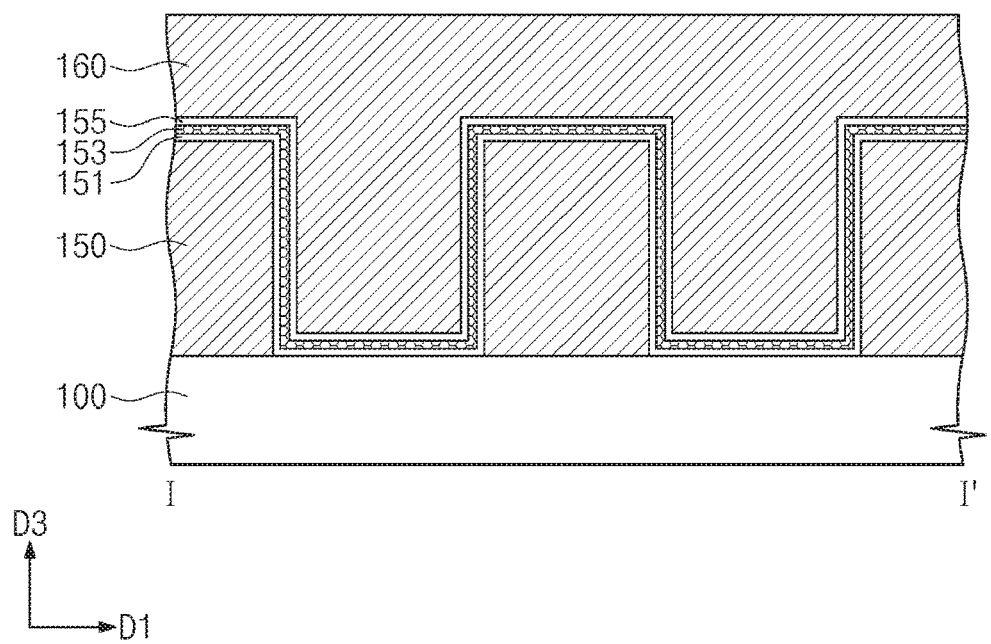

Referring to FIGS. 21 and 22C, a second conductive pattern 160 may be formed on the second dielectric layer 155. The second conductive pattern 160 may be formed to extend in the first direction D1 or along the second dielectric layer 155. For example, the second conductive pattern 160 may be formed of or include at least one of conductive materials (e.g., doped semiconductors, metals, conductive metal nitrides, or metal-semiconductor compounds).

Figure 22D:
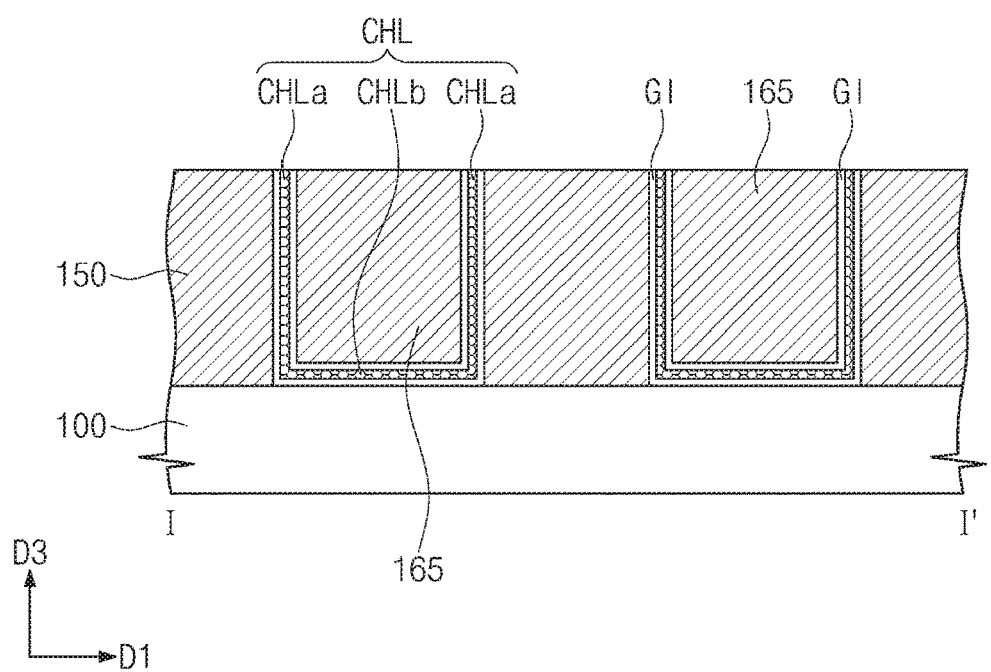

Referring to FIGS. 21 and 22D, the second conductive pattern 160 may be planarized to expose top surfaces of the first conductive patterns 150 and to form third conductive patterns 165. Upper portions of the first and second dielectric layers 151 and 155 and the preliminary channel layer 153 may be removed during the planarization process of the second conductive pattern 160. As a result, the first and second dielectric layers 151 and 155 may be patterned to form gate dielectric layers GI, and the preliminary channel layer 153 may be patterned to form the channel layers CHL.

Each of the channel layers CHL may be interposed between a pair of the first conductive patterns 150 and the third conductive pattern 165. Each of the channel layers CHL may include a pair of first portions CHLa and a second portion CHLb interposed between the pair of first portions CHLa. In other words, each of the channel layers CHL may be shaped like a letter Each of the gate dielectric layers GI may be interposed between the third conductive pattern 165 and the first conductive pattern 150. Each of the gate dielectric layers GI may be shaped like a letter 'U'.

Figure 22E:
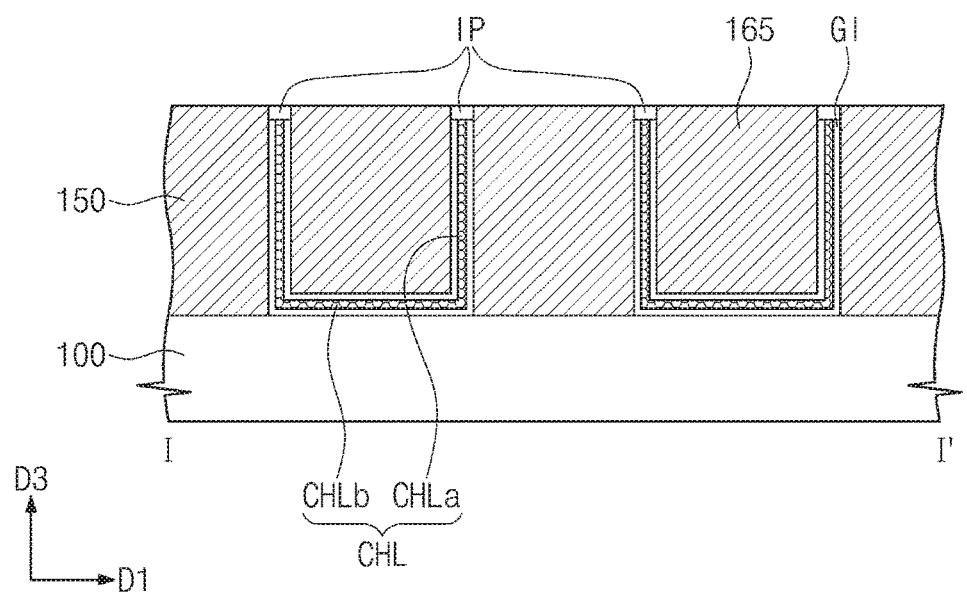

Referring to FIGS. 21 and 22E, insulating patterns IP may be formed on the channel layers CHL, respectively. For example, an etching process may be performed to vertically recess top surfaces of the channel layers CHL exposed between the first and third conductive patterns 150 and 165. Here, upper portions of the gate dielectric layers GI may also be recessed during the etching process of recessing the channel layers CHL. The insulating patterns IP may be formed to fill the recessed regions, respectively. In some exemplary embodiments, the insulating patterns IP may be formed of or include at least one of silicon oxide, silicon nitride, or silicon oxynitride.

Figure 22F:
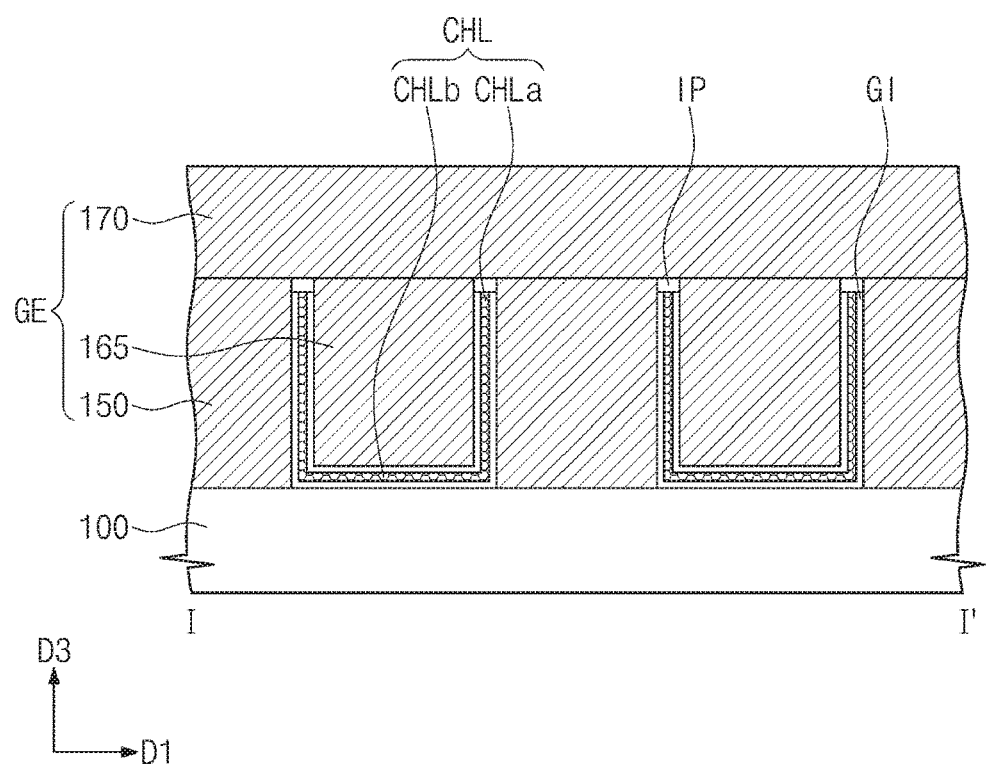

Referring to FIGS. 21 and 22F, a fourth conductive pattern 170 may be formed on the first conductive patterns 150 and the third conductive patterns 165. The fourth conductive pattern 170 may be formed to extend in the first direction D1 or along the first and third conductive patterns 150 and 165. The first, third, and fourth conductive patterns 150, 165, and 170 may constitute a gate electrode GE extending in the first direction D1. For example, the fourth conductive pattern 170 may be formed of or include at least one of conductive materials (e.g., doped semiconductors, metals, conductive metal nitrides, or metal-semiconductor compounds).

Figure 23:
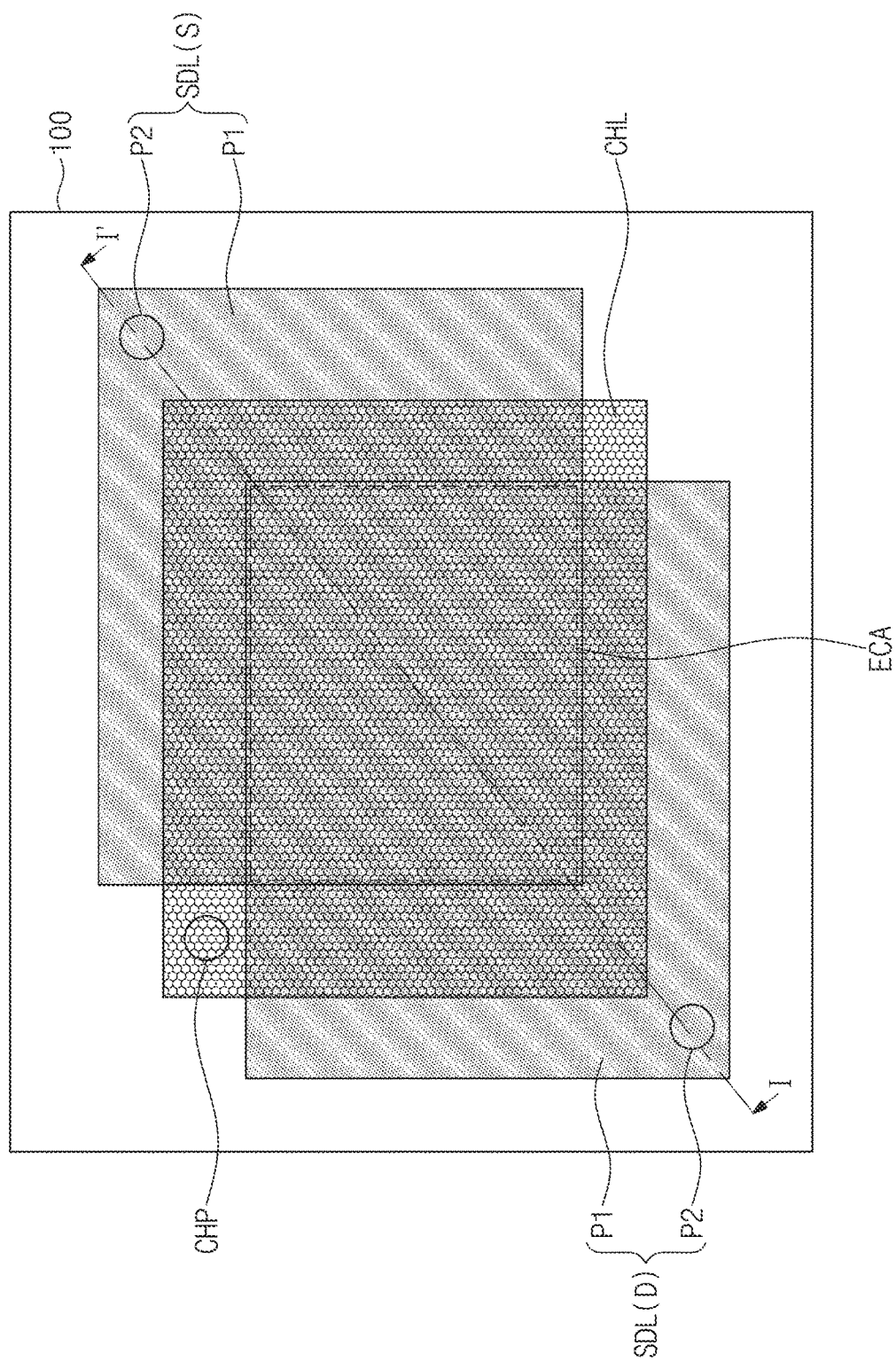
FIG. 23 is a plan view illustrating a light detection device according to some exemplary embodiments.
Figure 24:
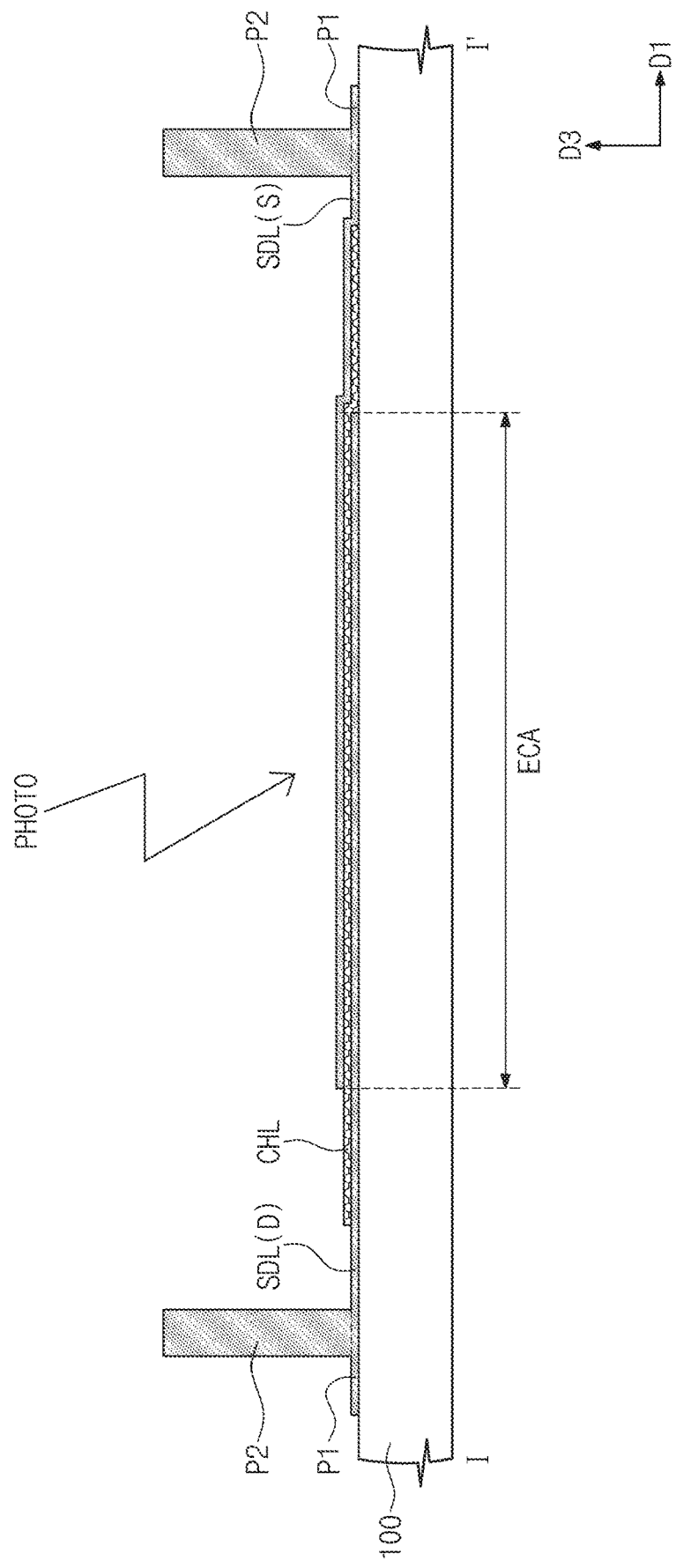
FIG. 24 is a sectional view taken along line I-I' of FIG. 23.

FIG. 23 is a plan view illustrating a light detection device according to some exemplary embodiments. FIG. 24 is a sectional view taken along line I-I' of FIG. 23.

Referring to FIGS. 23 and 24, a first source/drain layer SDL(S), a channel layer CHL, and a second source/drain layer SDL(D) may be sequentially stacked on a substrate 100. The first source/drain layer SDL(S), the channel layer CHL, and the second source/drain layer SDL(D) may be partially overlapped with each other, when viewed in a plan view. For example, the overlapped portions may constitute a detection region ECA. As an example, the first source/drain layer SDL(S) may be used as a source region S of the light detection device, and the second source/drain layer SDL(D) may be used as a drain region D of the light detection device. However, this is only an example.

The channel layer CHL may include a two-dimensional atomic layer made of a first material, and each of the first and second source/drain layers SDL(S) and SDL(D) may include a two-dimensional atomic layer made of a second material. For example, the channel layer CHL may be formed of phosphorene, and the first and second source/drain layers SDL(S) and SDL(D) may be formed of graphene. Since the phosphorene have generally a black color and thus has high light absorption efficiency, the phosphorene may be effectively used to generate photoelectrons, thereby serving as a channel region of a light detection device.

Portions of the first source/drain layer SDL(S), the channel layer CHL, and the second source/drain layer SDL(D) may be electrically and vertically connected to each other. For example, the portions of the first source/drain layer SDL(S), the channel layer CHL, and the second source/drain layer SDL(D) may be connected to each other by covalent bonds between the first and second materials or by a van der Waals' attractive force. The van der Waals' attractive force may be advantageous to realize an effective connection between the first and second materials with the two-dimensional structure.

For example, in the case where the graphene is coupled to a different material by a van der Waals' attractive force, carrier mobility may be deteriorated. However, in the case where the graphene is coupled to the phosphorene by the van der Waals' attractive force, it is possible to suppress or prevent deterioration of the carrier mobility. Except for this, the first and second materials may be configured to have substantially the same features as that described with reference to FIG. 1A.

Each of the first and second source/drain layers SDL(S) and SDL(D) may include a planar portion P1 and a pillar portion P2. For example, the pillar portion P2 may be positioned on regions of the planar portion P1 of the first and second source/drain layers SDL(S) and SDL(D) that are not overlapped with or spaced apart from the channel layer CHL. A channel pillar CHP may be provided on regions of the channel layer CHL that are not overlapped with or spaced apart from the first and second source/drain layers SDL(S) and SDL(D). As another example, the channel pillar CHP may be omitted.

The pillar portions P2 and the channel pillar CHP may be provided to have a longitudinal axis that is perpendicular to a top surface of the substrate 100 or parallel to a third direction D3. Accordingly, the pillar portions P2 and the channel pillar CHP may be used as contacts connected to the planar portions P1 and the channel layer CHL. Each of the pillar portions P2 and the channel pillar CHP may include a three-dimensional atomic layer that is formed of a third material (e.g., carbon nanotube). The channel pillar CHP and the channel layer CHL may be electrically connected to each other by covalent bonds between the first and third materials. Except for this, the pillar portions P2 may be configured to have substantially the same features as that of FIGS. 6A and 6B.

Furthermore, although not shown, interconnection lines may be provided on and electrically connected to the pillar portions P2 and the channel pillar CHP. In the case where a voltage is applied between the pillar portions P2 through the interconnection lines, the second source/drain layer SDL(D), to which a relatively high voltage is applied, may have an increased Fermi level, and the first source/drain layer SDL(S), to which a relatively low voltage is applied, may have a decreased Fermi level. In the case where photons are incident into the detection region ECA, carriers (e.g., electrons) may be generated in the channel layer CHL of the detection region ECA. The generated electrons may be accumulated in the second source/drain layer SDL(D) with the increased Fermi level. An increase in intensity of incident light may lead to an increase in an amount of electrons generated in the channel layer CHL, and this may lead to an increase in amount of an electric current flowing between the first and second source/drain layers SDL(S) and SDL(D). The incidence of the photons may be detected by measuring the amount of the electric current.

According to some exemplary embodiments, a semiconductor device may include a channel layer with a two-dimensional atomic layer, and this may make it possible to realize a field effect transistor with high carrier mobility and low leakage current. Furthermore, according to some exemplary embodiments, the channel layer and the source/drain layer may have a very small thickness (e.g., of the order of atom diameter), and this may make it possible to realize the highly-integrated semiconductor device.

While example embodiments of the inventive concepts have been particularly shown and described, it will be understood by one of ordinary skill in the art that variations in form and detail may be made therein without departing from the spirit and scope of the attached claims.

What is claimed is:
1. A semiconductor device comprising:
a channel layer provided on a substrate and extending perpendicular to a top surface of the substrate, the channel layer having a fin shaped structure having a first surface and a second surface opposite to the first surface, the first and second surfaces being perpendicular to the top surface of the substrate;
a source/drain layer disposed at a side of the channel layer and electrically connected to the channel layer; and
a gate electrode provided adjacent to the first and second surfaces of the channel layer and crossing the channel layer,
wherein the channel layer is made of a two-dimensional atomic layer of a first material, and
wherein the source/drain layer comprises a second material connected to the first material by covalent bonds.
2. The semiconductor device of claim 1, wherein the first material is phosphorene, graphene, hexagonal boron nitride, molybdenum disulphide (MoS2), silicene, or germanene, and
the second material is graphene, carbon nanotube, hexagonal boron nitride, molybdenum disulphide, silicene, or germanene.

3. The semiconductor device of claim 1, wherein the source/drain layer comprises a carbon nanotube, whose longitudinal axis is perpendicular to the top surface of the substrate, and the carbon nanotube is directly connected to the channel layer.

4. The semiconductor device of claim 1, wherein the channel layer comprises:

a first portion that extends in a direction perpendicular to the top surface of the substrate; and a second portion that extends from the first portion to be parallel to the top surface of the substrate.

5. The semiconductor device of claim 1, wherein the channel layer comprises a plurality of first portions and a plurality of second portions, which are connected to each other in a zigzag shape, and the source/drain layer comprises a first source/drain layer and a second source/drain layer connected to two opposite end portions, respectively, of the channel layer.

6. The semiconductor device of claim 1, further comprising:

an insulating layer covering the channel layer, the source/drain layer, and the gate electrode; and an interconnection line provided on the insulating layer and electrically connected to the source/drain layer.

7. The semiconductor device of claim 1, further comprising:

an insulating layer covering the channel layer, the source/drain layer, and the gate electrode; and a data storing element provided on the insulating layer and electrically connected to the source/drain layer.

8. The semiconductor device of claim 1, wherein the channel layer and the source/drain layer constitute an active layer, and a plurality of active layers are provided, the plurality of active layers are arranged on the substrate in a direction parallel to the top surface of the substrate, and the gate electrode is provided to commonly cross a plurality of channel layers of the plurality of active layers.

9. A semiconductor device comprising:

a fin shaped layer on a substrate, the fin shaped layer being formed of two-dimensionally arranged atoms and having a first surface and a second surface opposite to the first surface, the first and second surfaces being defined by the two-dimensionally arranged atoms constituting the fin shaped layer, the first and second surfaces being perpendicular to a top surface of the substrate; and a gate electrode on the first and second surfaces and crossing the fin shaped layer, wherein the gate electrode has a double gate structure.

10. The semiconductor device of claim 9, wherein the two-dimensionally arranged atoms are phosphorus atoms.

11. The semiconductor device of claim 9, wherein the fin shaped layer includes a channel layer having the first and second surfaces and a source/drain layer electrically connected to the channel layer.

12. The semiconductor device of claim 11, wherein the source/drain layer is connected to the channel layer by covalent bonds.

13. The semiconductor device of claim 9, further comprising:

an insulating layer on the fin shaped layer and the gate electrode; and an interconnection line on the insulating layer and electrically connected to at least one of the fin shaped layer and the gate electrode.

14. The semiconductor device of claim 9, further comprising:

an insulating layer on the fin shaped layer and the gate electrode; and a data storing element on the insulating layer and electrically connected to the fin shaped layer.

15. The semiconductor device of claim 9, wherein the fin shaped layer includes a plurality of fin shaped layers, the plurality of fin shaped layers are arranged on the substrate in a direction parallel to the top surface of the substrate, and the gate electrode extends in the direction and crosses the plurality of fin shaped layers.

16. A semiconductor device comprising:

a plurality of channel layers that are stacked on a substrate and vertically spaced apart from each other; and a gate electrode between vertically adjacent ones of the plurality of channel layers, wherein each of the plurality of channel layers comprises a two-dimensional atomic layer made of a first material.

17. The semiconductor device of claim 16, further comprising a source/drain layer electrically connected to at least one of the plurality of channel layers, wherein the source/drain layer comprises a second material connected to the first material by covalent bonds.

18. The semiconductor device of claim 17, wherein the first material is phosphorene, graphene, hexagonal boron nitride, molybdenum disulphide (MoS2), silicene, or germanene, and the second material is graphene, carbon nanotube, hexagonal boron nitride, molybdenum disulphide, silicene, or germanene.

19. The semiconductor device of claim 16, wherein the vertically adjacent ones of the plurality of channel layers include a first channel layer and a second channel layer, the first channel layer has a first surface defined by two-dimensionally arranged atoms, the second channel layer has a second surface facing the first surface, the second surface defined by two-dimensionally arranged atoms, and the gate electrode is between the first surface and the second surface.

\* \* \* \* \*